(12) United States Patent
Feilchenfeld et al.

(10) Patent No.: US 9,768,028 B1
(45) Date of Patent: Sep. 19, 2017

(54) SEMICONDUCTOR STRUCTURE WITH A DOPANT IMPLANT REGION HAVING A LINEARLY GRADED CONDUCTIVITY LEVEL AND METHOD OF FORMING THE STRUCTURE

(71) Applicant: GLOBALFOUNDRIES INC., Grand Cayman (KY)

(72) Inventors: Natalie B. Feilchenfeld, Jericho, VT (US); Michael J. Zierak, Colchester, VT (US); Theodore J. Letavic, Putnam Valley, NY (US); Yun Shi, San Diego, CA (US); Santosh Sharma, San Diego, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/232,873

(22) Filed: Aug. 10, 2016

(51) Int. Cl.
  *H01L 21/76* (2006.01)
  *H01L 21/311* (2006.01)
  (Continued)

(52) U.S. Cl.
  CPC ........ *H01L 21/266* (2013.01); *H01L 21/2253* (2013.01); *H01L 21/823814* (2013.01);
  (Continued)

(58) Field of Classification Search
  CPC . H01L 21/027; H01L 21/0334; H01L 27/127; H01L 27/1288; H01L 29/36;
  (Continued)

(56) References Cited

U.S. PATENT DOCUMENTS

| 6,127,703 | A  | 10/2000 | Letavic et al. |
| 7,964,485 | B1 | 6/2011  | French et al. |
| 8,207,578 | B2 | 6/2012  | French et al. |
| 8,330,214 | B2 | 12/2012 | Paul et al. |

(Continued)

FOREIGN PATENT DOCUMENTS

EP    1 438 752    8/2009

OTHER PUBLICATIONS

U.S. Appl. No. 15/635,288, Notice of Allowance dated Jul. 28, 2017, 9 pages.

*Primary Examiner* — Hsien Ming Lee
(74) *Attorney, Agent, or Firm* — Gibb & Riley, LLC; Michael J. LeStrange, Esq.

(57) ABSTRACT

Disclosed are methods that employ a mask with openings arranged in a pattern of elongated trenches and holes of varying widths to achieve a linearly graded conductivity level. These methods can be used to form a lateral double-diffused metal oxide semiconductor field effect transistor (LDMOSFET) with a drain drift region having an appropriate type conductivity at a level that increases essentially linearly from the body region to the drain region. Furthermore, these methods also provide for improve manufacturability in that multiple instances of this same pattern can be used during a single dopant implant process to implant a first dopant with a first type (e.g., N-type) conductivity into the drain drift regions of both first and second type LDMOSFETs (e.g., N and P-type LDMOSFETs, respectively). In this case, the drain drift region of a second type LDMOSFET can subsequently be uniformly counter-doped. Also disclosed are the resulting semiconductor structures.

19 Claims, 27 Drawing Sheets

(51) Int. Cl.
*H01L 21/302* (2006.01)
*H01L 21/266* (2006.01)
*H01L 29/78* (2006.01)
*H01L 29/10* (2006.01)
*H01L 29/08* (2006.01)
*H01L 27/092* (2006.01)
*H01L 21/8238* (2006.01)
*H01L 21/225* (2006.01)
*H01L 29/66* (2006.01)

(52) U.S. Cl.
CPC ........ *H01L 27/092* (2013.01); *H01L 29/0878* (2013.01); *H01L 29/1095* (2013.01); *H01L 29/66681* (2013.01); *H01L 29/7816* (2013.01)

(58) Field of Classification Search
CPC ... H01L 2224/0347; H01L 2224/03472; H01L 2224/03622
USPC ....... 438/700, 717, 736, 418, 444, 447, 449, 438/473, 476, 514, 519, 530, 546, 552
See application file for complete search history.

(56) References Cited

U.S. PATENT DOCUMENTS

| | | |
|---|---|---|
| 9,059,276 B2 | 6/2015 | Feilchenfeld et al. |
| 9,490,322 B2 | 11/2016 | Yang et al. |
| 2003/0107050 A1 | 6/2003 | Letavic et al. |
| 2011/0233670 A1 | 9/2011 | French et al. |
| 2014/0306347 A1* | 10/2014 | Schulze ............... H01L 21/225 257/773 |
| 2014/0346596 A1 | 11/2014 | Ellis-Monaghan et al. |
| 2015/0171213 A1 | 6/2015 | Hower et al. |

* cited by examiner

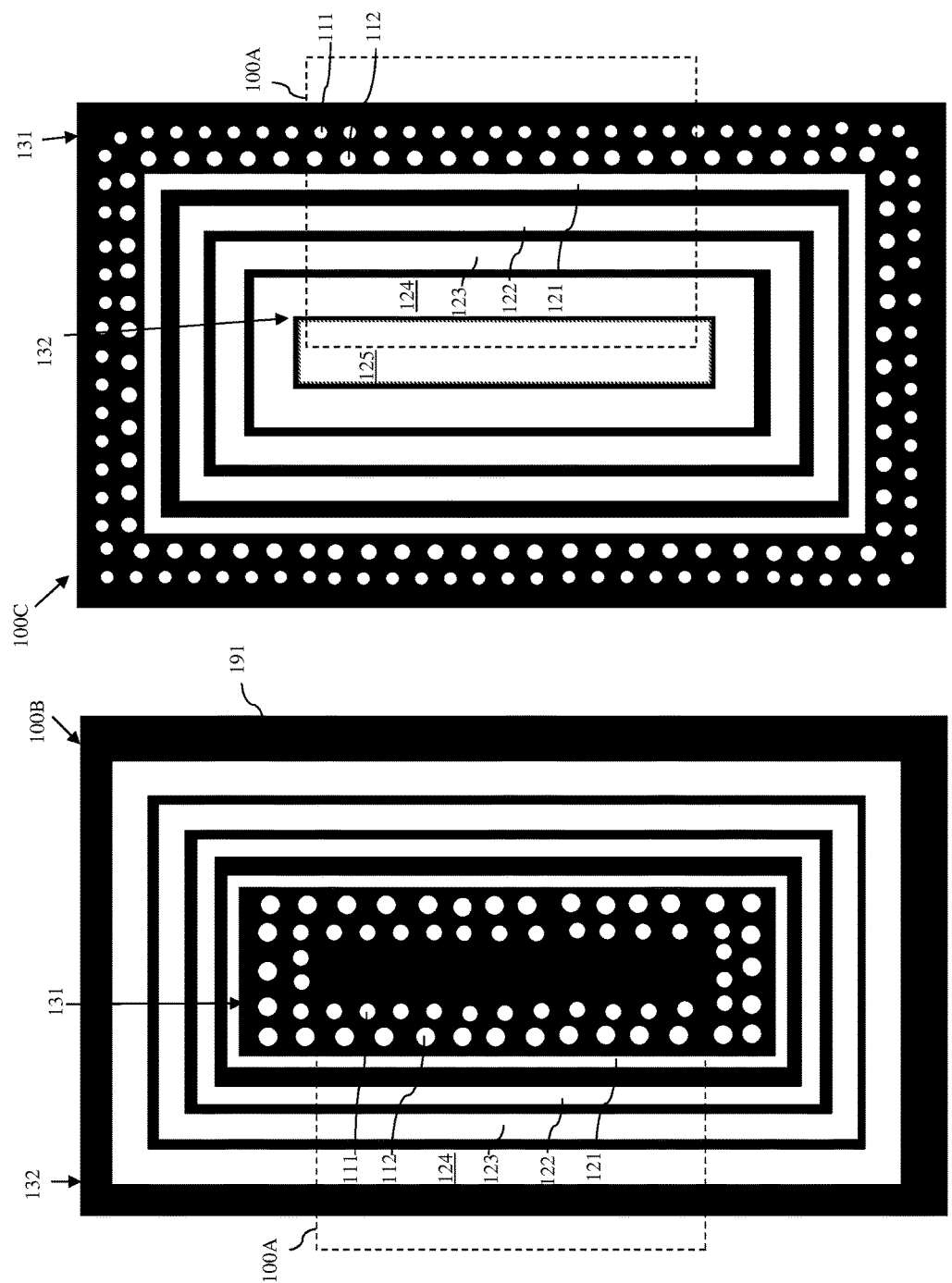

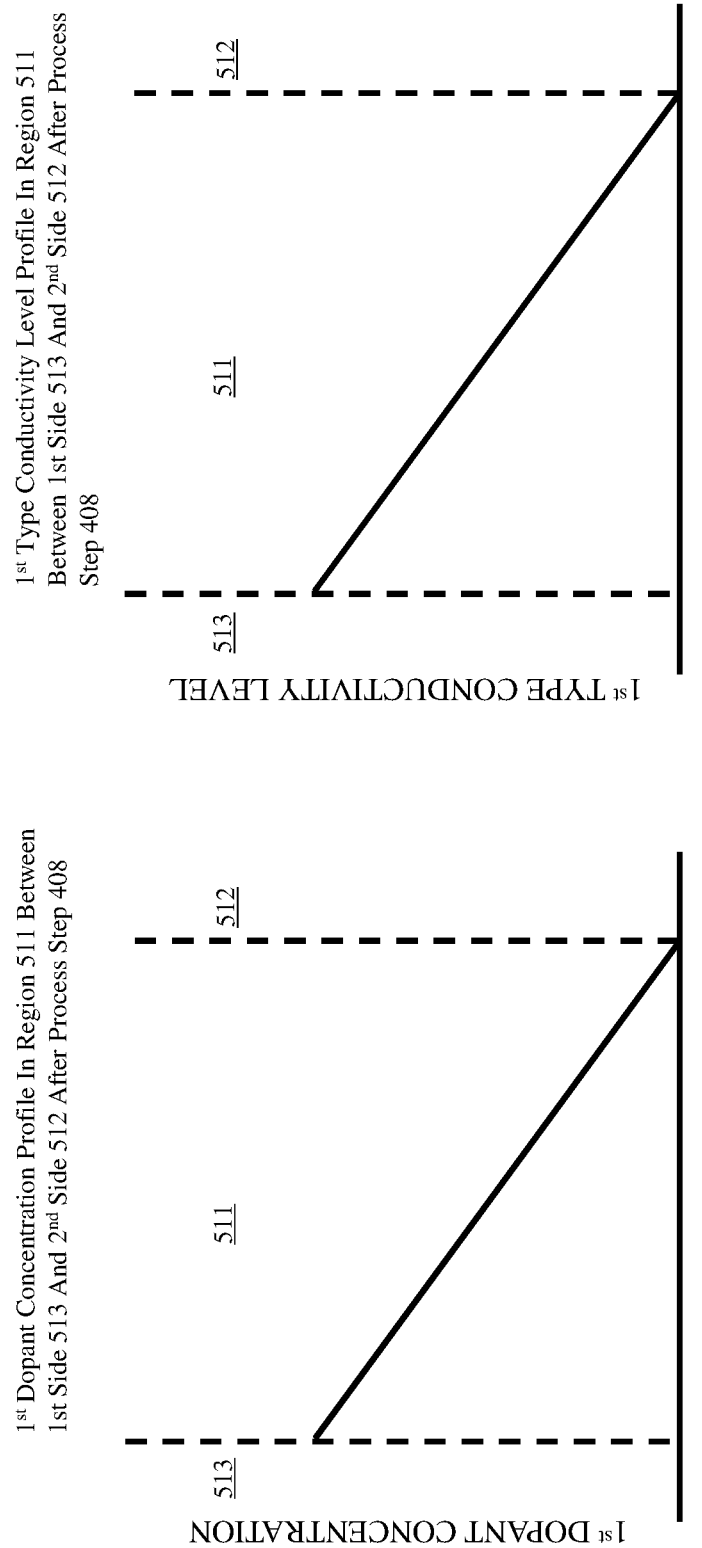

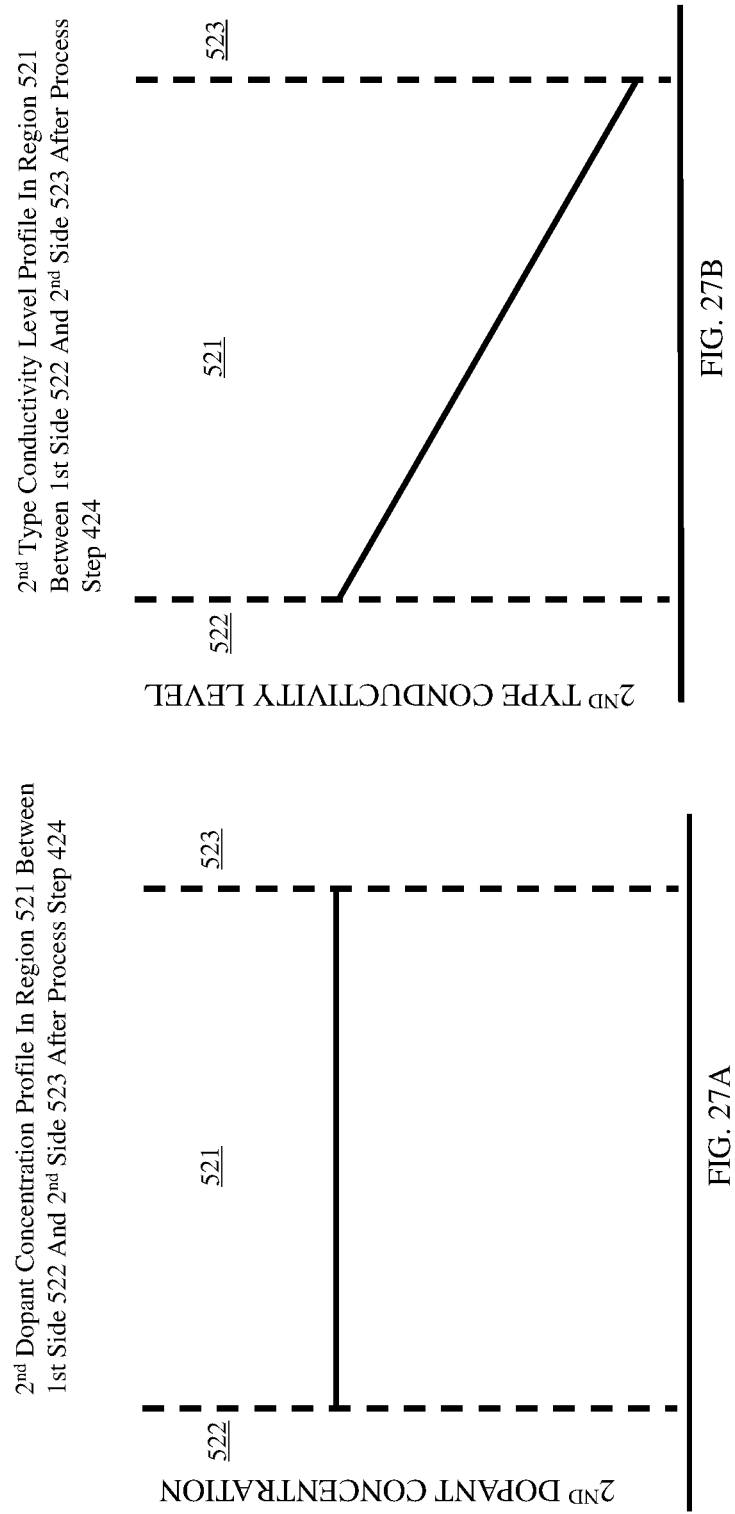

SEMICONDUCTOR STRUCTURE WITH A DOPANT IMPLANT REGION HAVING A LINEARLY GRADED CONDUCTIVITY LEVEL AND METHOD OF FORMING THE STRUCTURE

FIELD OF THE INVENTION

The present invention relates to semiconductor structures and, more particularly, to a semiconductor structure and a method of forming the structure so as to have one or more semiconductor devices (e.g., one or more planar lateral double-diffused metal oxide semiconductor field effect transistors (LDMOSFETs)), each with a dopant implant region having a linearly graded conductivity level.

BACKGROUND

Key goals in designing field effect transistors (FETs) for use in high voltage (HV) applications include, but are not limited to, high blocking voltage (BV) (also referred to as high breakdown voltage or high drain-source voltage ($V_{DS}$)) for operability at high voltages, low 'ON' resistance (Ron) for faster switching speeds, lower power losses, relatively small size and enhanced manufacturability in terms of time and cost. Oftentimes, design features that increase the likelihood of meeting one goal (e.g., high BV) result in a decrease in the likelihood of meeting one or more of the other goals (e.g., Ron) such that the design process involves trade-offs.

Recently, planar lateral double-diffused metal oxide semiconductor field effect transistors (LDMOSFETs) have been developed. An LDMOSFET, like a conventional MOSFET, has a channel region that is positioned laterally between a source region and a drain region. However, unlike a conventional MOSFET, the LDMOSFET is asymmetric with the channel region being closer to the source region than the drain region. Specifically, in an LDMOSFET, the channel region is separated from the source region by a first distance and is separated from the drain region by a second distance that is greater than the first distance. The space between the channel region and the drain region includes a relatively low-doped drain drift region that provides ballasting resistance so that the LDMOSFET has a relatively high BV. Additionally, the conductivity level profile of the drain drift region can be graded and, specifically, can increase from the channel region toward the drain region in order to minimize the Ron. While such LDMOSFETs have a relatively high BV and reduced Ron as compared to conventional MOSFETs, further improvements to the LDMOSFET structure and the method of forming the structure are needed in order to further reduce the Ron, to allow for device size scaling and/or to improve manufacturability (i.e., to reduce turn around time and cost associated with manufacturing).

SUMMARY

In view of the foregoing, disclosed herein are methods of forming a semiconductor structure with a dopant implant region having a given type conductivity at a level that increases essentially linearly from one side of the region to the other. To achieve the desired linearly graded conductivity level, these methods employ a unique mask, which has openings arranged in a particular pattern. These methods can, for example, be used to form a planar lateral double-diffused metal oxide semiconductor field effect transistors (LDMOSFET) with a drain drift region having an appropriate type conductivity at a level that increases essentially linearly from the body region to the drain region for a reduced 'ON' resistance (Ron). Furthermore, as discussed in greater detail below, these methods also provide for improved manufacturability in that multiple instances of this same pattern can be used during a single dopant implant process to implant a first dopant with a first type (e.g., N-type) conductivity into the drain drift regions of both first and second type LDMOSFETs (e.g., N and P-type LDMOSFETs, respectively). In this case, the drain drift region of a second type LDMOSFET can subsequently be uniformly counter-doped with a second dopant having the second type (e.g., a P-type) conductivity in order to achieve the desired linearly graded conductivity level therein. Also disclosed herein are the resulting semiconductor structures.

More particularly, disclosed herein are methods of forming a semiconductor structure with a dopant implant region having a given type conductivity at a level that increases essentially linearly from one side of the region to the other. In the methods, a mask can be formed on a semiconductor layer. The mask can have multiple openings that extend vertically to a region of the semiconductor layer. The region can have a first side and a second side opposite the first side and the openings in the mask can be arranged in a particular pattern. Specifically, the pattern of the openings can include at least one set of aligned holes above a first portion of that region at the first side and trenches above a second portion of that region at the second side, wherein the trenches are elongated relative to the holes and wherein the widths of the holes and the trenches increase from the first side to the second side.

After the mask is formed, a dopant implant process can be performed in order to implant a first dopant with a first type conductivity into the region through the pattern of openings in the mask. Then, an anneal process can be performed such that, within the region, a concentration profile of the first dopant increases essentially linearly from the first side to the second side. As a result, following the dopant implant process and the anneal, the region will have the first type conductivity at a level that increases essentially linearly from the first side to the second side.

Optionally, an additional mask can subsequently be formed on the semiconductor layer, wherein the additional mask has an opening that exposes the region. Then, an additional dopant implant process can be performed in order to implant a second dopant with a second type conductivity essentially uniformly across the region. In this case, the amount of the second dopant implanted into the region should be sufficient to ensure that, following the additional dopant implant process, the region will have the second type conductivity at a level that increases essentially linearly from the second side to the first side.

Also disclosed herein are methods of forming lateral double-diffused metal oxide semiconductor field effect transistors (LDMOSFETs), each with a drain drift region having an appropriate type conductivity at a level that increases essentially linearly from the body region to the drain region for a reduced 'ON' resistance (Ron). In the methods, a mask can be formed on a semiconductor layer. This mask can have patterned sections above drain drift regions for different LDMOSFETs in the semiconductor layer (e.g., above a first drain drift region of a first LDMOSFET and a second drain drift region of a second type LDMOSFET). Each drain drift region can have a first side and a second side opposite the first side. Each patterned section of the mask can have multiple openings that extend vertically to a corresponding one of the drain drift regions and that are arranged in a particular pattern. Specifically, the pattern of openings in each patterned section above each drain drift region can include at least one set of aligned holes above a first portion of that drain drift region at the first side and trenches above a second portion of that drain drift region at the second side, wherein the trenches are elongated relative to the holes and wherein the widths of the holes and the trenches increase from the first side to the second side.

After the mask is formed, a dopant implant process can be performed in order to implant a first dopant with a first type conductivity into each of the drain drift regions through the patterns of openings in each of the patterned sections of the mask. Then, an anneal can be performed such that, within each drain drift region, a concentration profile of the first dopant increases essentially linearly from the first side to the second side. As a result, both the first drain drift region of the first type LDMOSFET and the second drain drift region of the second type LDMOSFET will have the first type conductivity at a level that increases essentially linearly from the first side to the second side.

Subsequently, an additional mask can be formed on the semiconductor layer. This additional mask can cover the first drain drift region of the first LDMOSFET and can have an opening that exposes the second drain drift region of the second type LDMOSFET. After the additional mask is formed, an additional dopant implant process can be performed in order to implant a second dopant with a second type conductivity essentially uniformly across the second drain drift region. In this case, the amount of the second dopant implanted into the second drain drift region should be sufficient to ensure that, following the additional dopant implant process, the conductivity type and conductivity level profile of the second drain drift region of the second type LDMOSFET is different than that of first drain drift region of the first type LDMOSFET and, more particularly, to ensure that the second drain drift region of the second type LDMOSFET will now have the second type conductivity at a level that increases essentially linearly from the second side of the second drain drift region to the first side of the second drain drift region.

Also disclosed herein are various semiconductor structures resulting from the above-described methods. For example, one such semiconductor structure includes a semiconductor layer and at least one field effect transistor. The field effect transistor can have, within the semiconductor layer, a drain drift region positioned laterally between a body region with a first type conductivity and a drain region with a second type conductivity. The drain drift region can be doped with a first dopant having the first type conductivity and with a second dopant having the second type conductivity. Specifically, in the drain drift region, the first dopant can have a concentration profile that increases essentially linearly across the drain drift region from the drain region to the body region and the second dopant can have a concentration profile that is approximately uniform across the drain drift region. In this case, the amount of the second dopant in the second drain drift region should be sufficient to ensure that the drain drift region has the second type conductivity at a level that increases essentially linearly from the body region to the drain region.

Optionally, the semiconductor structure can further include an additional field effect transistor. The additional field effect transistor can have, within the semiconductor layer, an additional body region, an additional drain region and an additional drain drift region extending laterally from the additional body region to the additional drain region. The additional drain drift region can be doped with the first dopant and can have a concentration profile that increases essentially linearly across the additional drain drift region from the additional body region to the additional drain region such that the additional drain drift region has the first type conductivity at a level that increases essentially linearly from the additional body region to the additional drain region.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 1B is a top view diagram illustrating another mask with another pattern that includes the pattern in FIG. 1A;

FIG. 1C is a top view diagram illustrating yet another mask with another pattern that also includes the pattern in FIG. 1A;

FIGS. 17A and 17B are graphs illustrating a dopant concentration profile and a corresponding conductivity level profile, respectively, across a region of FIG. 16;

DETAILED DESCRIPTION

Figure 1A:
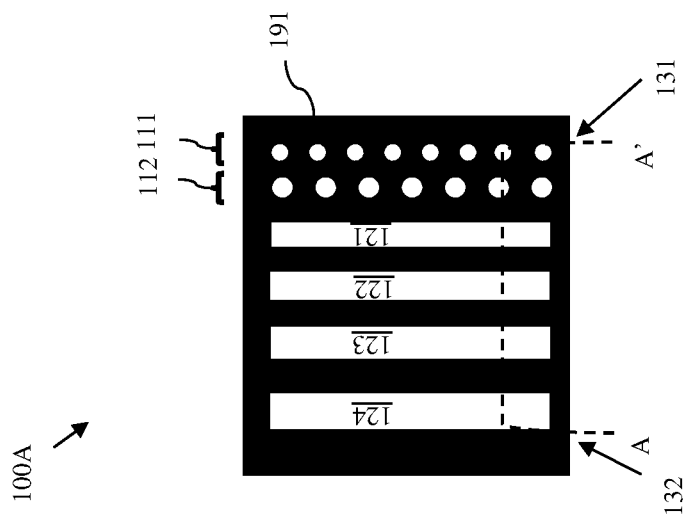
FIG. 1A is a top view diagram illustrating a mask with a pattern.

As mentioned above, recently, planar lateral double-diffused metal oxide semiconductor field effect transistors (LDMOSFETs) have been developed. An LDMOSFET, like a conventional MOSFET, has a channel region that is positioned laterally between a source region and a drain region. However, unlike a conventional MOSFET, the LDMOSFET is asymmetric with the channel region being closer to the source region than the drain region. Specifically, in an LDMOSFET, the channel region is separated from the source region by a first distance and is separated from the drain region by a second distance that is greater than the first distance. The space between the channel region and the drain region includes a relatively low-doped drain drift region that provides ballasting resistance so that the LDMOSFET has a relatively high BV. Additionally, the conductivity level of the drain drift region can be graded and, specifically, can increase from the channel region toward the drain region in order to minimize the Ron. While such LDMOSFETs have a relatively high BV and reduced Ron as compared to conventional MOSFETs, further improvements to the LDMOSFET structure and the method of forming the structure are needed in order to further reduce the Ron, to allow for device size scaling and/or to improve manufacturability (i.e., to reduce turn around time and cost associated with manufacturing).

For example, although, as mentioned above, a drain drift region with a graded conductivity level reduces the Ron of an LDMOSFET, currently used techniques for doping the drift region result in a dopant profile that is only approximately linearly graded (e.g., result in a dopant profile that is stepped as opposed to actually linear). Thus, there is a need for an improved technique for forming an LDMOSFET so that the conductivity level of the drain drift region more closely approaches a linearly graded conductivity level. Additionally, for complementary metal oxide semiconductor (CMOS) switches that incorporate both P-type LDMOSFET(s) and N-type LDMOSFET(s), the aspect ratios of the two devices are chosen such that the 'ON' resistance of the P-type LDMOSFET(s) ($Ron_{p\text{-}type}$) and the 'ON' resistance of the N-type LDMOSFET(s) ($Ron_{n\text{-}type}$) are the same (i.e., are equal resistance values). Since holes have a lower mobility than electrons, this means that the P-type LDMOSFET(s) will be larger than the N-type LDMOSFET(s). Thus, there is a need in the art for an improved technique for forming N-type LDMOSFETs and P-type LDMOSFETs such that the P-type LDMOSFETs are the same size and have approximately the same 'ON' resistance as the N-type LDMOSFETs. For enhanced manufacturability, this technique should allow such N-type LDMOSFETs and P-type LDMOSFETs to be formed using at least some of the same mask and implant levels.

In view of the foregoing, disclosed herein are methods of forming a semiconductor structure with a dopant implant region having a given type conductivity at a level that increases essentially linearly from one side of the region to the other. To achieve the desired linearly graded conductivity level, these methods employ a unique mask, which has openings arranged in a particular pattern. These methods can, for example, be used to form a planar lateral double-diffused metal oxide semiconductor field effect transistor (LDMOSFET) with a drain drift region having an appropriate type conductivity at a level that increases essentially linearly from the body region to the drain region for a reduced 'ON' resistance (Ron). Furthermore, as discussed in greater detail below, these methods also provide for improve manufacturability in that multiple instances of this same pattern can be used during a single dopant implant process to implant a first dopant with a first type (e.g., N-type) conductivity into the drain drift regions of both first and second type LDMOSFETs (e.g., N and P-type LDMOSFETs, respectively). In this case, the drain drift region of a second type LDMOSFET can subsequently be uniformly counter-doped with a second dopant having the second type (e.g., a P-type) conductivity in order to achieve the desired linearly graded conductivity level therein. Also disclosed herein are the resulting semiconductor structures.

More particularly, in the various methods disclosed herein and described in detail below, a unique mask can be used to implant a dopant into a dopant implant region of a semiconductor layer such that the concentration profile of that dopant in the dopant implant region, following an anneal process, increases essentially linearly from one side of the region to another.

As illustrated in FIG. 1A, this mask 191 can be patterned so as to have a pattern 100A of openings that extend vertically therethrough. This mask 191 can, for example, be a patterned photoresist layer or, alternatively, a patterned hardmask layer. Techniques for patterning a photoresist layer and also for patterning a hardmask layer from a patterned photoresist layer are well known in the art. Thus, the details of such techniques have been omitted from this specification in order to allow the reader to focus on the salient aspect of the disclosed methods.

In any case, the openings in the pattern 100A of the mask 191 can have different shapes and sizes. Specifically, the openings can include at least one set of aligned holes (e.g., see sets 111 and 112 of aligned holes) and multiple, essentially parallel, trenches (see trenches 121-124). As illustrated, the trenches are elongated relative to the holes. That is, the first openings can be relatively small holes and the second openings can be elongated trenches. For purposes of illustration, two sets 111-112 of aligned holes and four elongated trenches 121-124 are shown. However, it should be understood that any number of one or more sets of aligned holes and two or more elongated trenches could, alternatively, be used. Additionally, for purposes of illustration, the holes in the sets 111-112 are shown as being essentially circular in shape (i.e., circular holes). However, it should be understood that any other suitable shape (e.g., square holes) could, alternatively, be used. In any case, as illustrated, all first openings in a given set (e.g., all holes in set 111, all holes in set 112, etc.) can be essentially aligned (i.e., arranged in a line) and can have the same width (or diameter). Additionally, adjacent sets of aligned holes can be arranged essentially parallel to each other and to the elongated trenches 121-124 such that the first set 111 of aligned holes defines a first side 131 (i.e., a first outermost edge) of the pattern 100A, the last set 112 of aligned holes is positioned adjacent to the first elongated trench 121 and the last elongated trench 124 defines a second side 132 (i.e., a second outermost edge) of the pattern 100A opposite the first side 131. Furthermore, the widths of the holes in the sets 111-112 and the widths of the trenches 121-124 can increase across the pattern 100A from the first side 131 to the second side 132. That is, the holes in the first set 111 of aligned holes can have a narrower width than the holes in the last set 112 of aligned holes and the first elongated trench 121 can have a narrower width than the second elongated trench 122, the second elongated trench 122 can have a narrower width than the third elongated trench 123, and so on.

Optionally, the pattern 100A of openings, described above, can be a portion of a racetrack pattern 100B in the mask 191, as shown in FIG. 1B, or a portion of an alternative racetrack pattern 100C, as shown in FIG. 1C. That is, the elongated trenches 121-124 can be portions of track-shaped trenches and the at least one set of aligned holes (e.g., see sets 111-112 of aligned holes) can be a portion of at least one track-shaped set of holes. For purposes of this disclosure, it should be understood that a "track-shaped" feature is a feature with a continuous shape that is annular with respect to a center region (i.e., that surrounds a center region) and that a "track-shaped" feature can be, for example, rectangular (as shown), square, oval, circular, or any other suitable shape. In any case, the track-shaped trenches can be arranged concentrically around the at least one track-shaped set of holes such that the first side 131 of the pattern 100A is located near the center of the racetrack pattern 100B and the second side 132 of the pattern 100A is located adjacent the outside of the racetrack pattern 100B, as shown in FIG. 1B. Alternatively, at least one track-shaped set of holes can be arranged concentrically around the track-shaped trenches such that the first side 131 of the pattern 100A is located at the outside of the racetrack pattern 100C and the second side 132 of the pattern 100A is near the center of the racetrack pattern 100C, as shown in FIG. 1C. It should be noted that, optionally, the racetrack pattern 100C can include an additional opening 125 that extends through the center portion of the racetrack (see more detailed discussion at process 404 of the flow diagram of FIG. 13, below).

Figure 2:
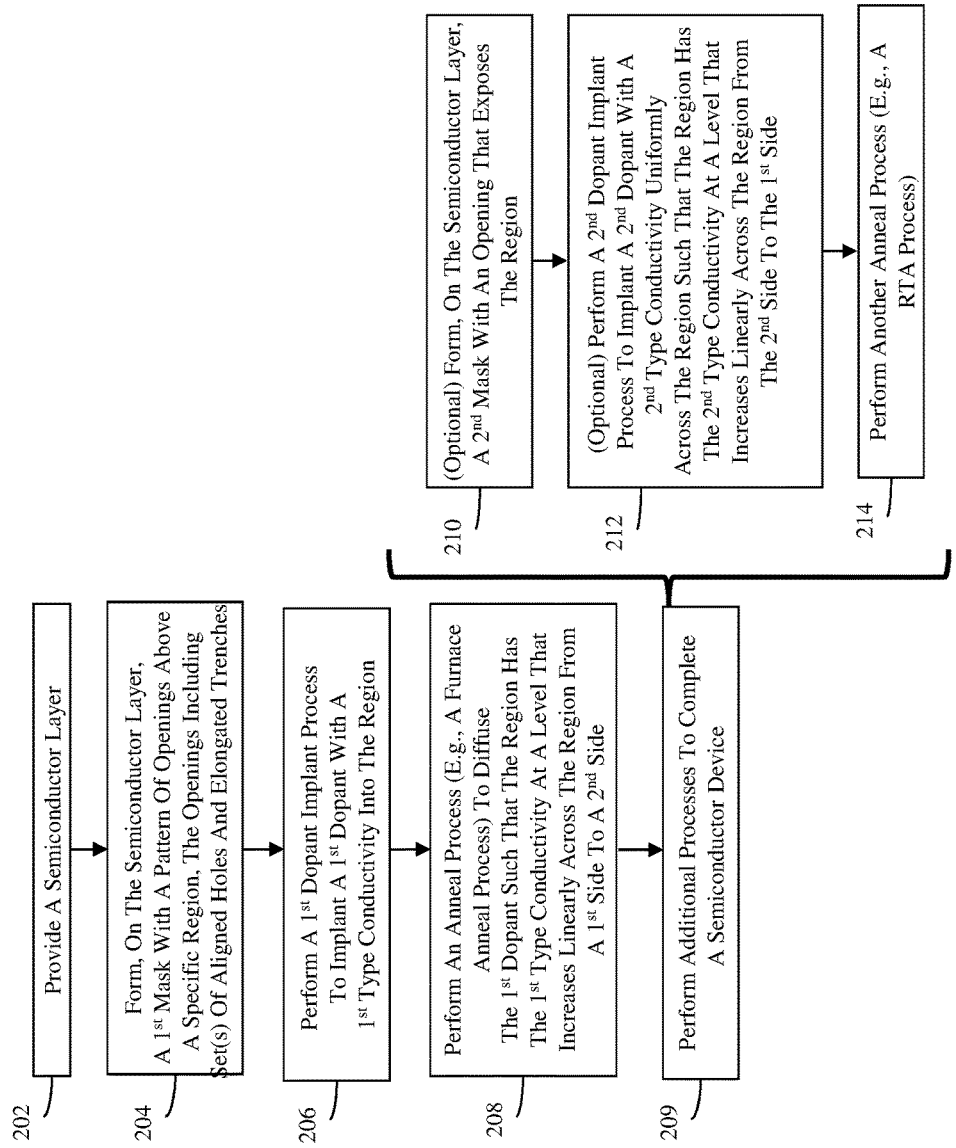
FIG. 2 is a flow diagram illustrating a method of using one of the masks of FIGS. 1A-1C to form a semiconductor structure with a semiconductor device having a dopant implant region with a linearly graded dopant concentration profile.

FIG. 2 is a flow diagram illustrating a method of using a mask with the same pattern 100A, as described above and illustrated in FIG. 1A (or, alternatively, as described above and illustrated in FIG. 1B or 1C) to form a semiconductor structure with a semiconductor device (e.g., a lateral double-diffused metal oxide semiconductor field effect transistor (LDMOSFET) or any other semiconductor device) having a dopant implant region with a linearly graded dopant concentration profile and, thereby a linearly graded conductivity level.

Figure 3:
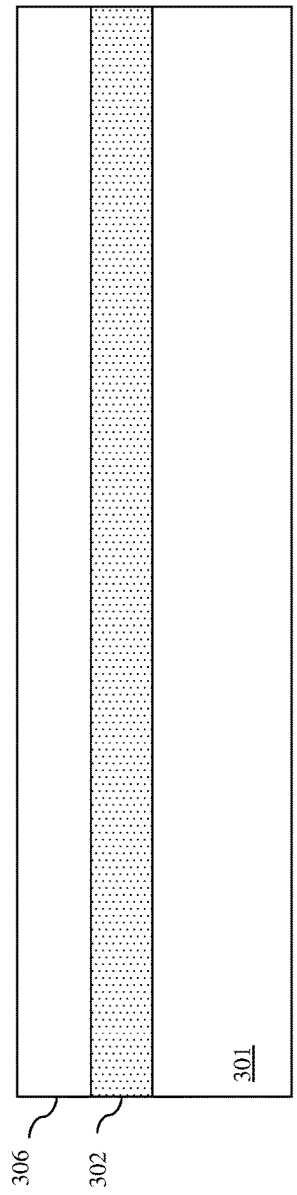
FIGS. 3-6 are cross-section diagrams each illustrating a different partially completed structure formed according to the method of FIG. 2.

The method can begin by providing a semiconductor layer 306 (202, see FIG. 3). This semiconductor layer 306 can, for example, be the semiconductor layer of a semiconductor-on-insulator (SOI) wafer, which includes a semiconductor substrate 301 (e.g., a silicon substrate or any other suitable semiconductor substrate), an insulator layer 302 (e.g., a silicon dioxide ($SiO_2$) layer or any other suitable insulator layer) on the semiconductor substrate 301 and a semiconductor layer 306 (e.g., a silicon layer, a silicon germanium layer, a gallium nitride layer or any other suitable semiconductor layer) on the insulator layer 302. Alternatively, the semiconductor layer 306 can be an upper portion of a bulk semiconductor wafer (e.g., a silicon wafer or any other suitable wafer, such as a hybrid orientation (HOT) wafer), wherein the upper portion is isolated from a lower portion of the wafer, for example, by deep well (not shown).

Figure 4:
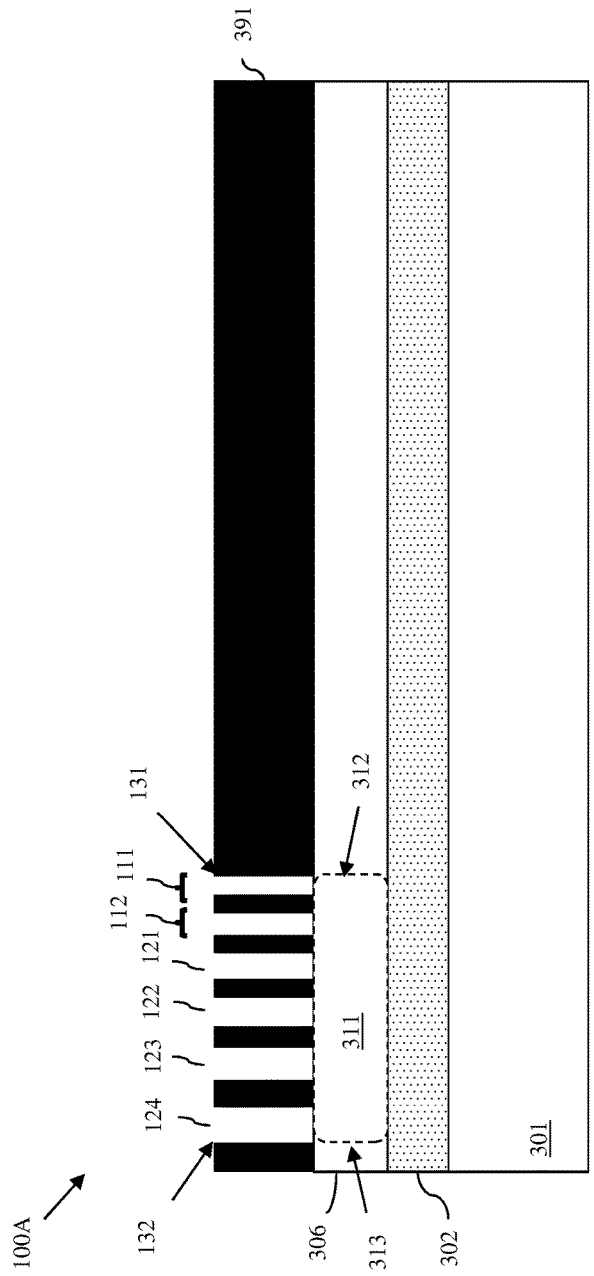

In any case, a mask 391 can be formed on the semiconductor layer 306 (204, see FIG. 4). Specifically, the mask 391 (e.g., a patterned photoresist layer or, alternatively, patterned hardmask layer, as discussed above) can be formed on the semiconductor layer 306 so as to have the pattern 100A of openings (e.g., as illustrated in FIG. 1A or, alternatively, in FIG. 1B or 1C). The pattern 100A can be aligned above a specific region 311 within the semiconductor layer 306 such that the openings extend vertically through the mask 391 to the top surface of the semiconductor layer 306 above that region 311. The region 311 of the semiconductor layer 306 can have a first side 312 and a second side 313 opposite the first side 312 and the pattern 100A can be oriented such that its first side 131 (i.e., its first outermost edge) is aligned above the first side 312 of the region 311 and such that its second side 132 (i.e., its second outermost edge) is aligned above the second side 313 of the region 311. Consequently, at least one set of aligned holes (e.g., see sets 111 and 112 of aligned holes) is above a first portion of the region 311 at the first side 312; the elongated trenches 121-124 are above a second portion of the region 311 at the second side 313; the widths of the aligned holes in the set(s) 111-112 and the widths of the trenches 121-124 increase across the top surface of the region 311 from the first side 312 to the second side 313; and the amount of surface area of the semiconductor layer 306 exposed by the openings in the mask 391 increases across the region 311 from the first side 312 to the second side 313, as illustrated.

Figure 5:
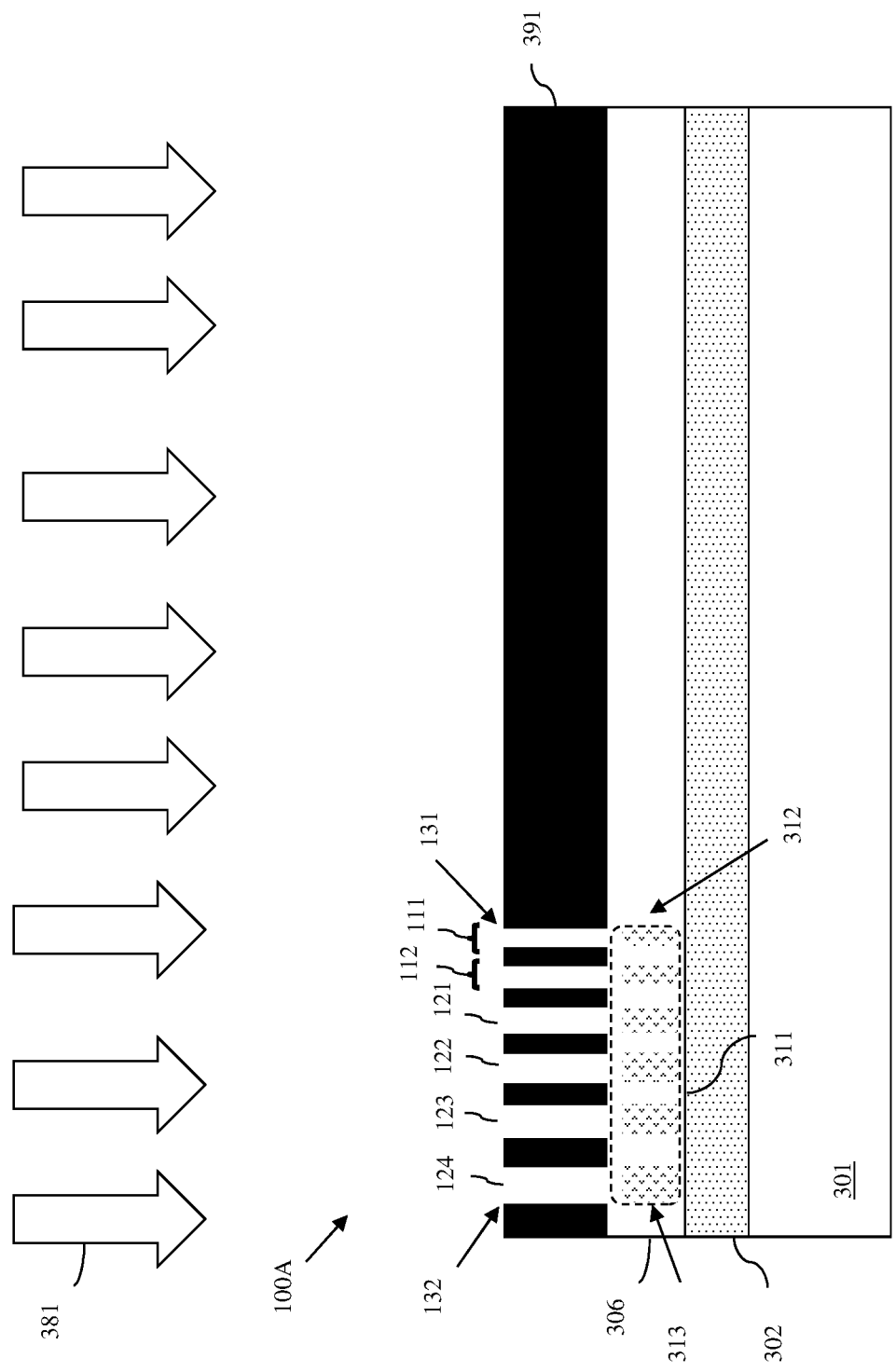

After the mask 391 is formed, a dopant implant process can be performed in order to implant a first dopant 381 with a first type (e.g., N-type) conductivity through the openings in the pattern 100A and into the region 311 of the semiconductor layer 306 (206, see FIG. 5). It should be noted that the implant energy associated with this dopant implant process can be such that the first dopant 381 extends from the top surface of the semiconductor layer 306 to the bottom surface of the semiconductor layer 306 (or, in the case of a bulk semiconductor substrate, to the deep well between the upper and lower portions of the substrate). For example, a phosphorous ion dose of 1E13 ions/$cm^2$ and an ion implant energy of 300 KeV could be used. The mask 391 can be removed following the dopant implant process 206.

Figure 6:
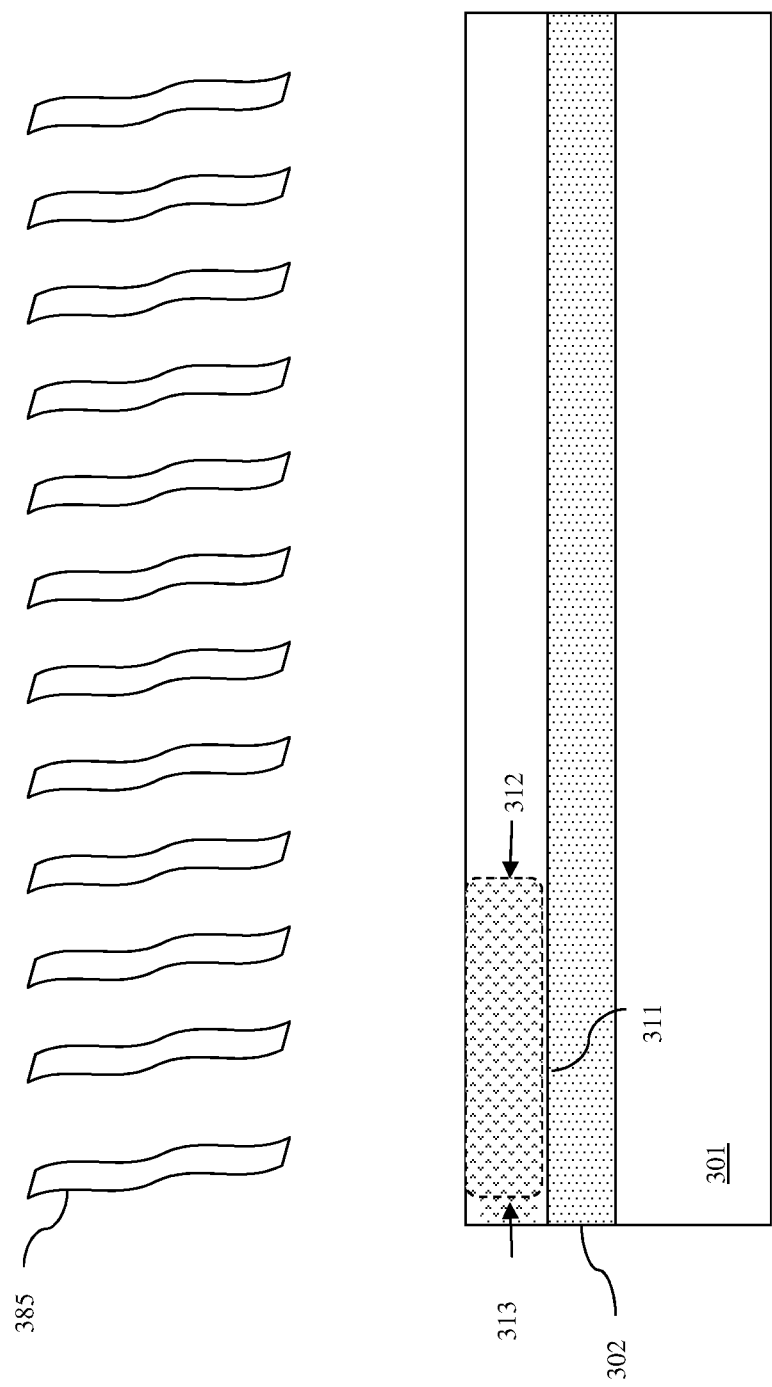
Figure 7A:
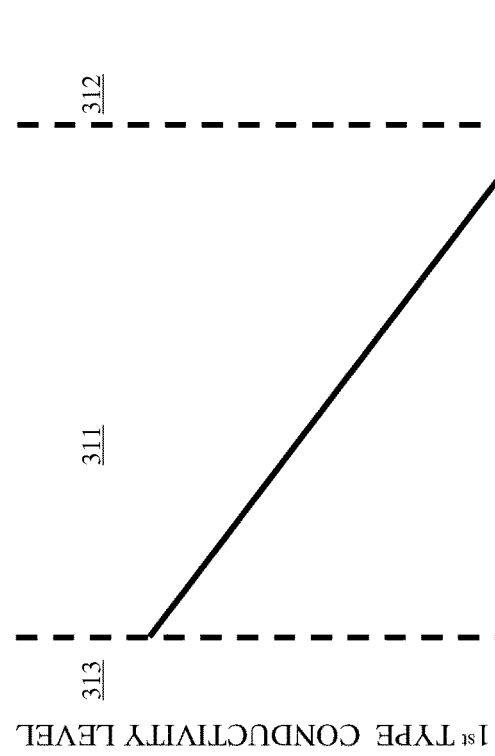
FIGS. 7A and 7B are graphs illustrating a dopant concentration profile and a corresponding conductivity level profile, respectively, across a region of FIG. 6.
Figure 7B:
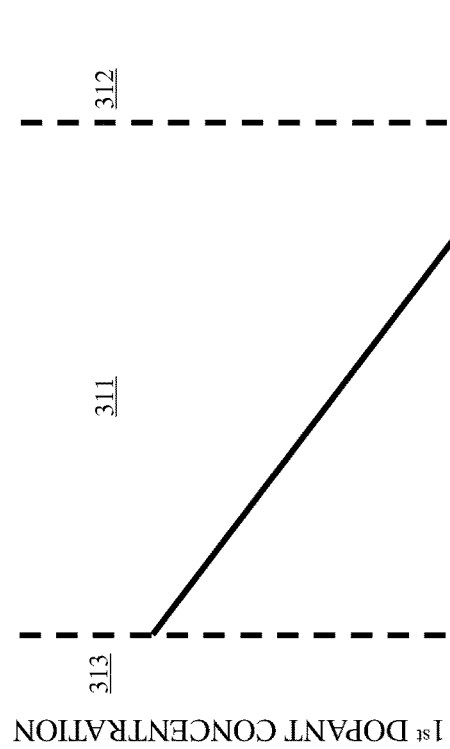

Following the dopant implant process 206, an anneal process can be performed (208, see FIG. 6). Specifically, the semiconductor layer 306 can be exposed to heat 385 at a relatively high temperature for a relatively long period of time in order to cause diffusion of the first dopant 381, which was previously implanted into the region 311. This anneal process 208 should be performed such that the first dopant diffuses within the region 311 and, as a result, the concentration profile of the first dopant 381 within the region 311 increases essentially linearly from the first side 312 of the region 311 to the second side 313, as shown in the graph of FIG. 7A. Thus, following the anneal 208, the region 311 will have the first type conductivity at a level that increases essentially linearly from the first side 312 of the region 311 to the second side 313, as illustrated in FIG. 7B. Those skilled in the art will recognize that the required anneal temperature as well as the required anneal duration for this anneal process will vary depending on the diffusion distance required to achieve the desired linearly graded conductivity level and that this diffusion distance will be dictated by the exact dimensions and spacing of the pattern of openings in the mask. Thus, the type of anneal process used can be any anneal process suitable for achieving the required anneal temperature for the required anneal duration. This anneal process could, for example, be a furnace anneal process or any other suitable anneal process. Exemplary specifications for a furnace anneal that can be used at process 208 include an anneal temperature ranging from 950-1350° C. (e.g., 1150° C.) and an anneal duration of 1½-2½ hours (e.g., 2 hours).

After the anneal process 208, various additional processes can be performed in order to complete the semiconductor device (209). Those skilled in the art will recognize that these various additional processes will vary depending upon the semiconductor device being formed.

Figure 8:
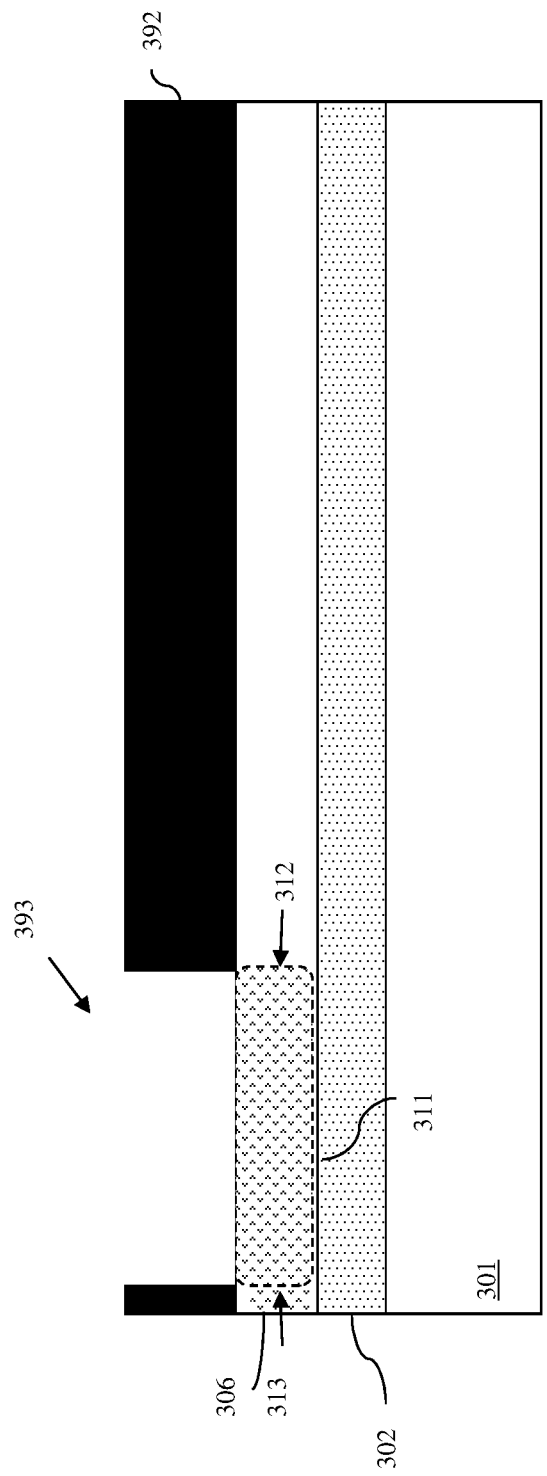
FIGS. 8-10 are cross-section diagrams each illustrating a different partially completed structure formed according to the method of FIG. 2.
Figure 9:
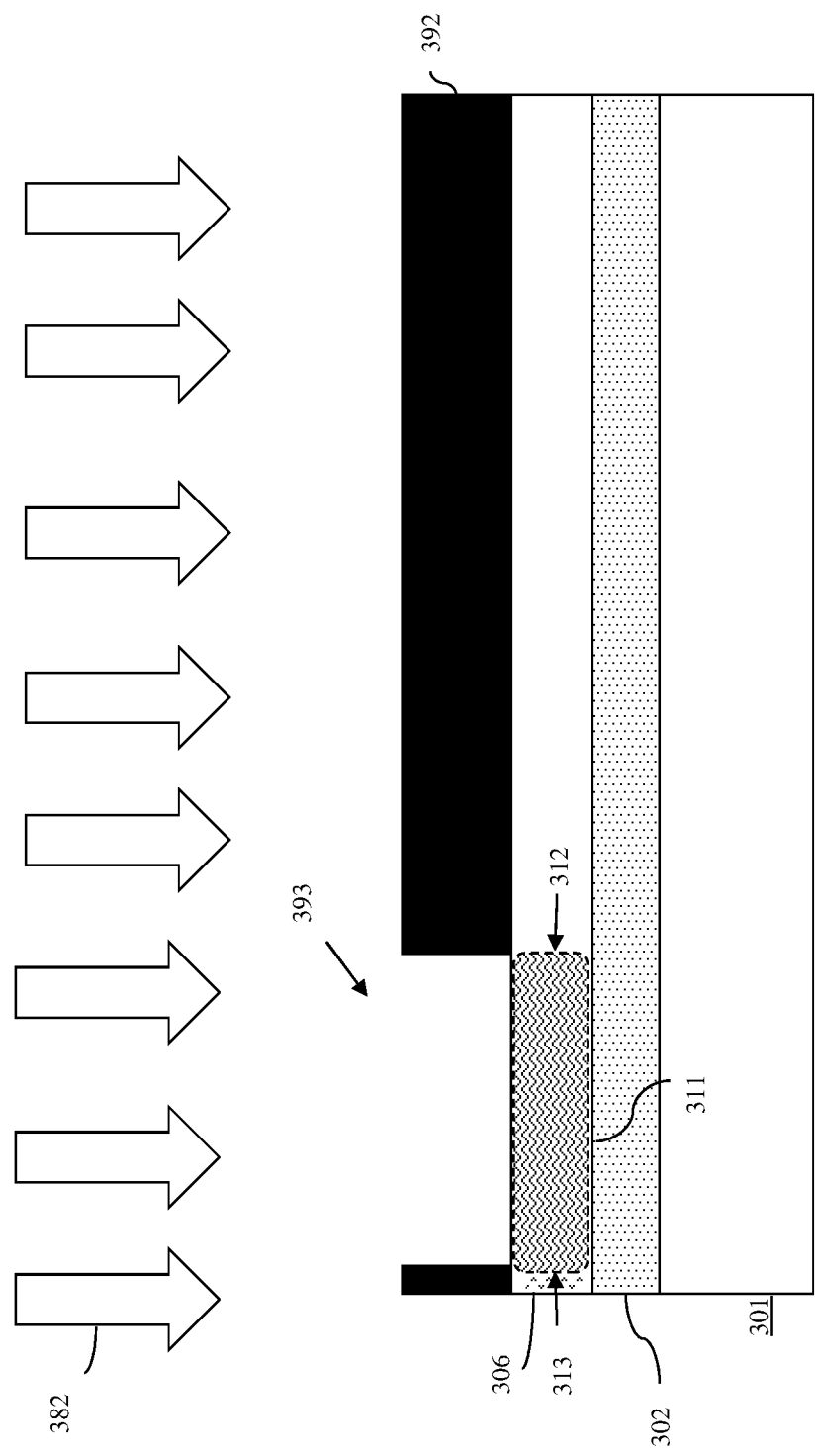

Optionally, these various additional processes 209 can include the formation of an additional mask 392 on the semiconductor layer 306 (210), an additional dopant implant process (212) and a additional anneal process (214). Specifically, the additional mask 392 (e.g., another patterned photoresist layer or patterned hardmask layer) can be formed on the semiconductor layer 306 so as to have an opening 393 that exposes at least the entire portion of the top surface of the semiconductor layer 306 above the region 311, as shown in FIG. 8. After this additional mask 392 is formed, an additional dopant implant process can be performed in order to implant a second dopant 382 with a second type (e.g., P-type) conductivity essentially uniformly across the region 311 from the first side 312 to the second side 313, as shown in FIG. 9. This additional dopant implant process 212 can specifically be a counter-doping process, wherein a predetermined concentration of the second dopant is uniformly implanted into the region 311. It should be noted that the implant energy associated with the additional dopant implant process 212 can be essentially the same as the implant energy associated with the dopant implant process 206 such that the second dopant is implanted throughout the region 311 from the top surface to the bottom surface of the semiconductor layer 306.

Figure 10:
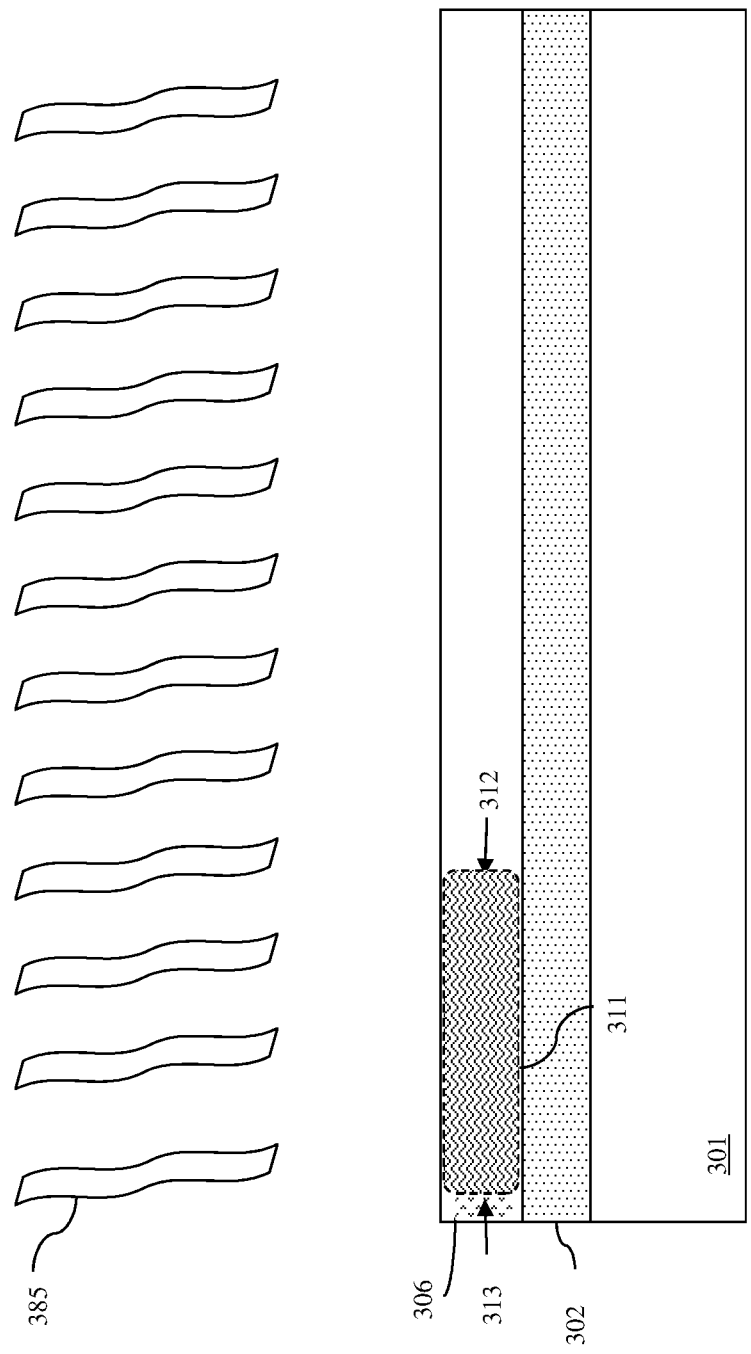
Figure 11A:
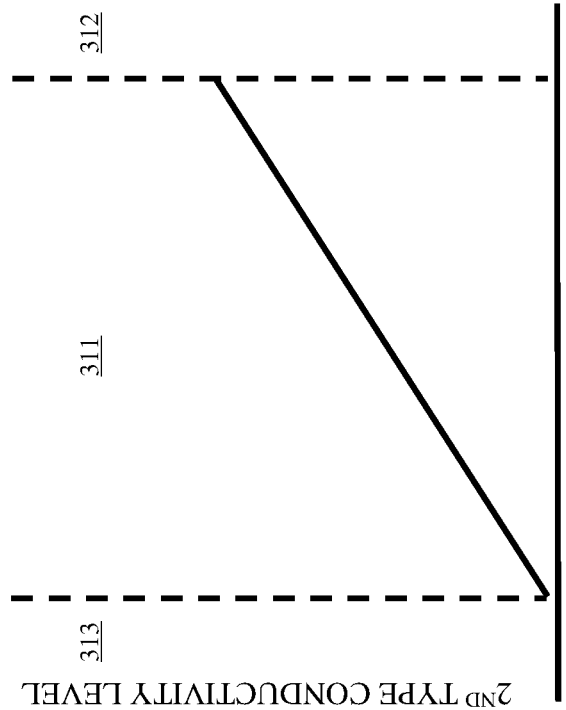
FIGS. 11A and 11B are graphs illustrating a dopant concentration profile and a corresponding conductivity level profile, respectively, across a region of FIG. 10.
Figure 11B:
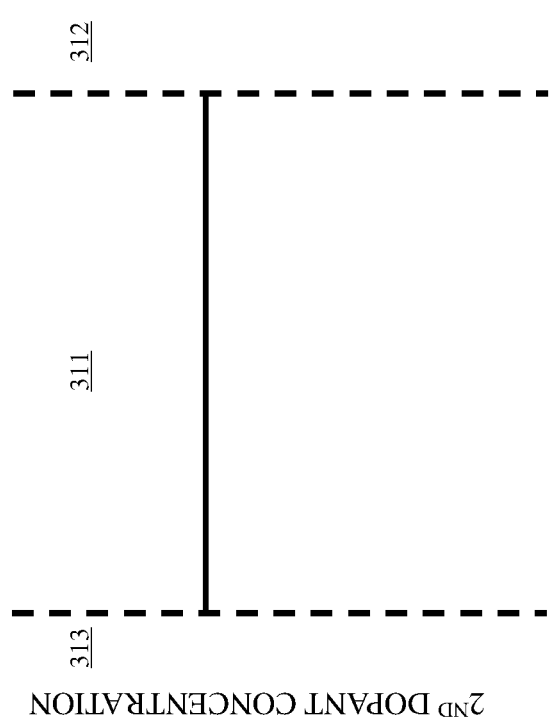

After the additional dopant implant process 212, an additional anneal process can subsequently be performed. In this additional anneal process 214, the semiconductor layer 306 can be exposed to heat 385 at a relatively high temperature for a short period of time in order to electrically activate the dopants implanted into the region 311 and to also electrically activate any other dopants implanted into any other regions of the semiconductor device, as required, as shown in FIG. 10. It should be noted that the concentration of the second dopant 382 used during the additional dopant implant process 212 and the specifications for the additional anneal process 214 (e.g., the anneal temperature and the anneal duration) should be predetermined in order to ensure the following: (1) only minimal diffusion of the second dopant 382; (2) the region 311 takes on the second type conductivity from the first side 312 to the second side 313; and (3) although the concentration of the second dopant 382 is approximately uniform across the region 311 from the first side 312 to the second side 313, as shown in the graph of FIG. 11A, the level of conductivity (i.e., the second type conductivity level) increases essentially linearly from the second side 313 to the first side 312, as shown in the graph of FIG. 11B, because of the previous doping of the region 311 with the first dopant at process 206. This additional anneal process can be, for example, a rapid thermal anneal (RTA) process or any other suitable anneal process. Exemplary specifications for a RTA process that can be used at process 214 include an anneal temperature ranging from 900-1000° C. (e.g., 950° C.) and an anneal duration of 3-7 seconds (e.g., 5 seconds).

Figure 12:
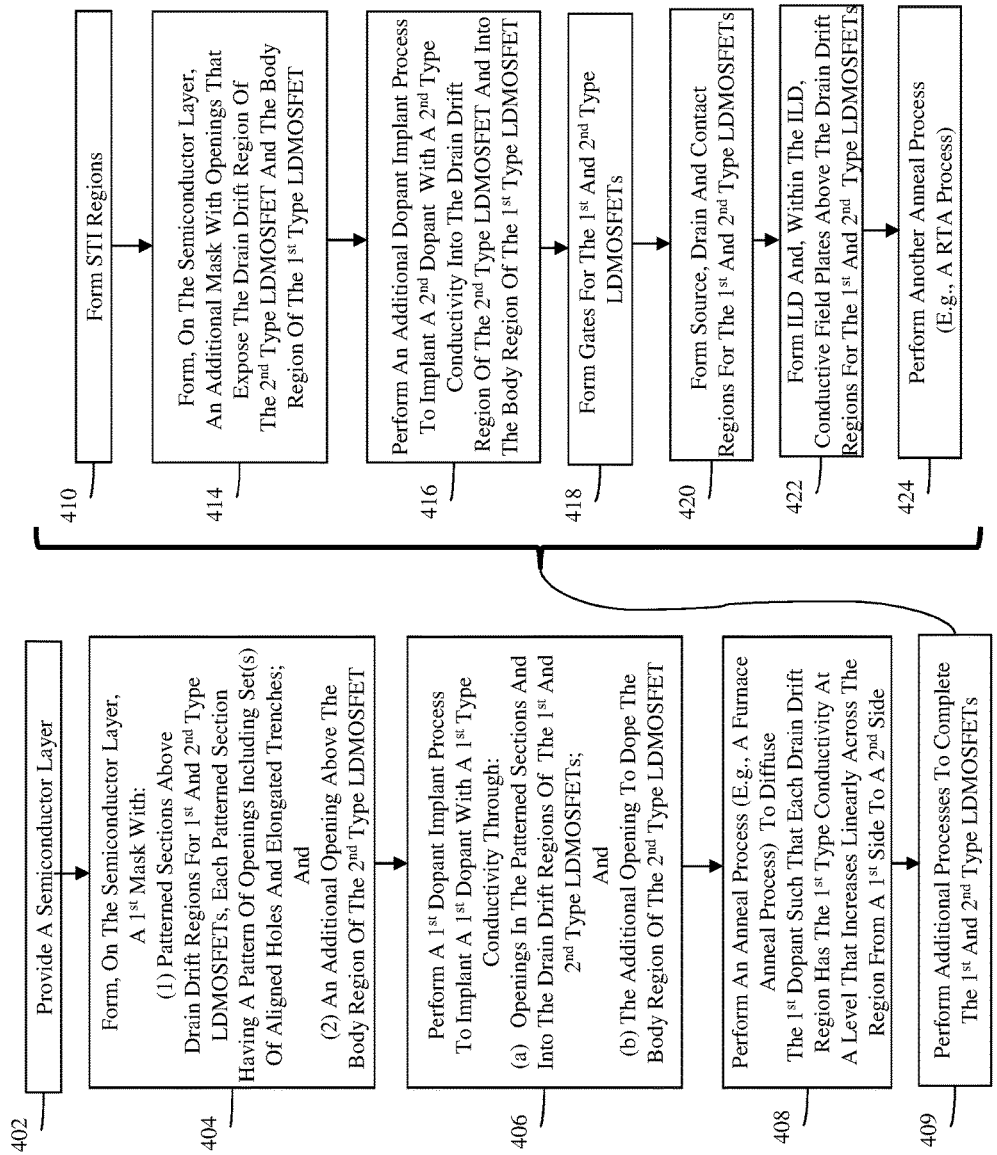
FIG. 12 is a flow diagram illustrating a method of forming a semiconductor structure with one or more lateral double-diffused metal oxide semiconductor field effect transistors, each with a drain drift region having a linearly graded conductivity level.

FIG. 12 is a flow diagram illustrating, more specifically, a method of forming a semiconductor structure with one or more lateral double-diffused metal oxide semiconductor field effect transistors (LDMOSFETs) (e.g., a first type LDMOSFET, such as an N-type LDMOSFET, and/or a second type LDMOSFET, such as a P-type LDMOSFET), each with a drain drift region having a linearly graded conductivity level for a reduced 'ON' resistance (Ron).

Figure 13:
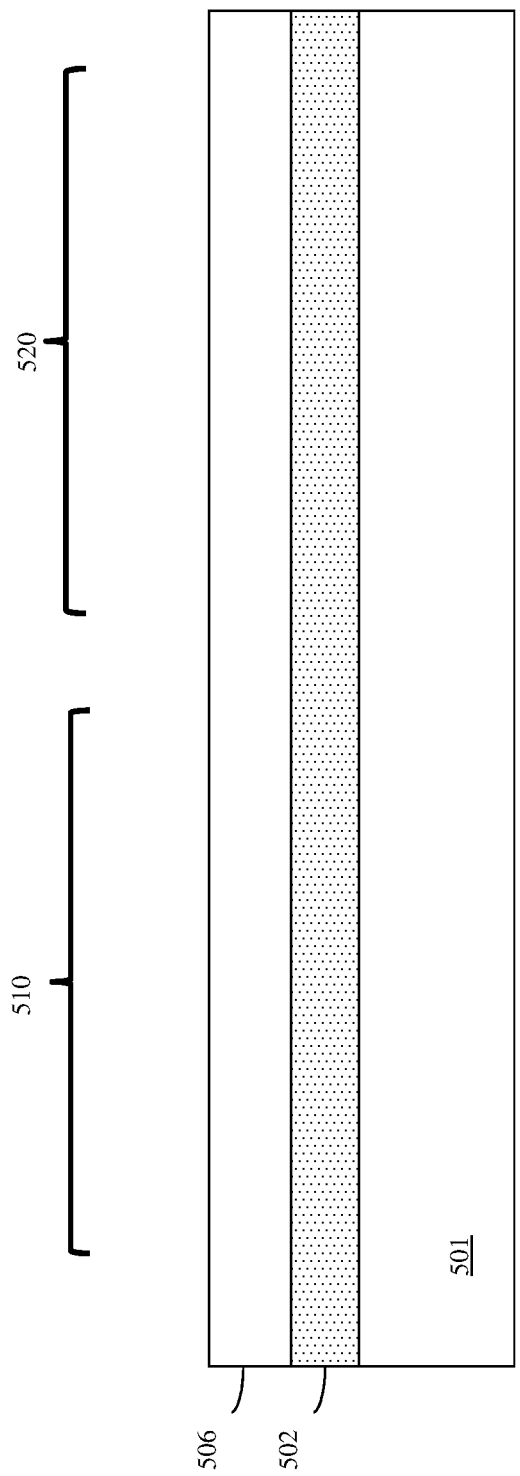
FIG. 13 is a cross-section diagram illustrating a partially completed structure formed according to the method of FIG. 12.

The method can begin by providing a semiconductor layer 506 (402, see FIG. 13). This semiconductor layer 506 can, for example, be the semiconductor layer of a semiconductor-on-insulator (SOI) wafer, which includes a semiconductor substrate 501 (e.g., a silicon substrate or any other suitable semiconductor substrate), an insulator layer 502 (e.g., a silicon dioxide ($SiO_2$) layer or any other suitable insulator layer) on the semiconductor substrate 501 and a semiconductor layer 506 (e.g., a silicon layer, a silicon germanium layer, a gallium nitride layer or any other suitable semiconductor layer) on the insulator layer 502. Alternatively, the semiconductor layer 506 can be an upper portion of a bulk semiconductor wafer (e.g., a silicon wafer or any other suitable wafer, such as a hybrid orientation (HOT) wafer), wherein the upper portion is isolated from a lower portion of the wafer, for example, by deep well (not shown).

Figures 14A, 14B:
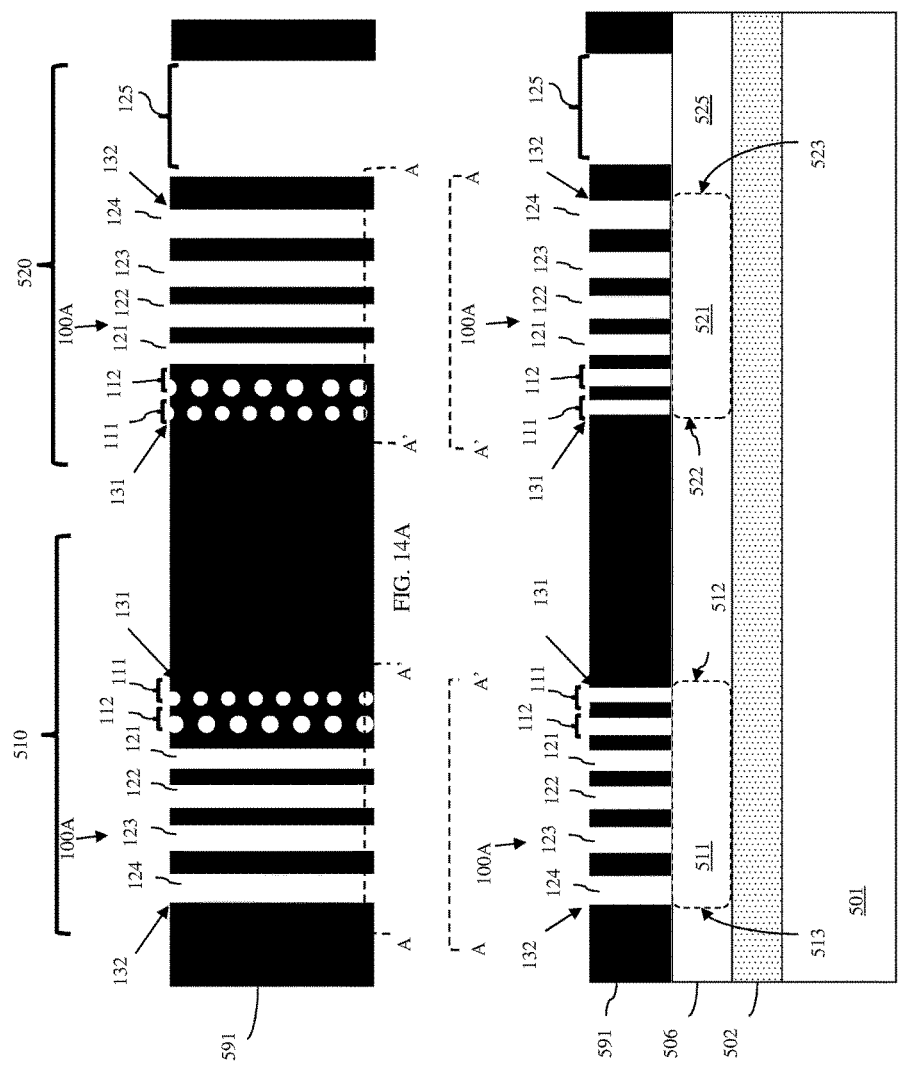
FIGS. 14A and 14B are top view and cross-section diagrams, respectively, each illustrating a different partially completed structure formed according to the method of FIG. 12.

In any case, a mask 591 can be formed on the semiconductor layer 506 (404, see FIG. 14A (top view) and 14B (cross-section)). Specifically, the mask 591 (e.g., a patterned photoresist layer or, alternatively, a patterned hardmask layer, as discussed above) can be formed on the semiconductor layer 506 so as to have patterned sections above different regions of the semiconductor layer 506 and, particularly, above designated drain drift regions in the semiconductor layer 506 for different LDMOSFETs. For example, the mask 591 can have a first patterned section above a first drain drift region 511 in the semiconductor layer 506 for a first type LDMOSFET 510 (e.g., an N-type LDMOSFET) and a second patterned section above a second drain drift region 521 in the semiconductor layer 506 for a second type LDMOSFET 520 (e.g., a P-type LDMOSFET). Each patterned section can be patterned with the pattern 100A of openings (e.g., as illustrated in FIG. 1A or, alternatively, as illustrated in FIG. 1B or 1C and described in detail above) above a specific region within the semiconductor layer 506.

As shown in FIGS. 14A-14B, the mask 591 can have a first instance of the pattern 100A of openings aligned above the first drain drift region 511 for the first type LDMOSFET 510 such that the openings extend vertically through the mask 591 to the top surface of the semiconductor layer 506 above that first drain drift region 511. The first drain drift region 511 for the first type LDMOSFET 510 can have a first side 512 and a second side 513 opposite the first side 512. The first instance of the pattern 100A can be oriented such that the first side 131 of the pattern 100A is aligned above the first side 512 of the first drain drift region 511 and such that the second side 132 of the pattern 100A is aligned above the second side 313 of the first drain drift region 511. Consequently, for the first instance of the pattern 100A, the at least one set of aligned holes (e.g., see sets 111 and 112 of aligned holes) is above a first portion of the first drain drift region 511 at the first side 512, the elongated trenches 121-124 are above a second portion of the first drain drift region 511 at the second side 513 and the widths of the holes in the set(s) 111-112 and the widths of the trenches 121-124 increase across the top surface of the first drain drift region 511 from its first side 512 to its second side 513. Thus, the amount of surface area of the semiconductor layer 506 exposed by the openings in the first instance of the pattern 100A in the mask 591 increases across the first drain drift region 511 from its first side 512 to its second side 513.

The mask 591 can also have a second instance of the pattern 100A of openings aligned above a second drain drift region 521 for the second type LDMOSFET 520 such that the openings extend vertically through the mask 591 to the top surface of the semiconductor layer 506 above that second drain drift region 521. The second drain drift region 521 for the second type LDMOSFET 520 can have a first side 522 and a second side 523 opposite the first side 522. The second instance of the pattern 100A can be oriented such that the first side 131 of the pattern 100A is aligned above the first side 522 of the second drain drift region 521 and such that the second side 132 of the pattern 100A is aligned above the second side 523 of the second drain drift region 521. Consequently, for the second instance of the pattern 100A, the at least one set of aligned holes (e.g., see sets 111 and 112 of aligned holes) is above a first portion of the second drain drift region 521 at the first side 512, the elongated trenches 121-124 are above a second portion of the second drain drift region 521 at the second side 523 and the widths of the holes in the set(s) 111-112 and the widths of the trenches 121-124 increase across the top surface of the second drain drift region 521 from its first side 522 to its second side 523. Thus, the amount of surface area of the semiconductor layer 506 exposed by the openings in the second instance of the pattern 100A in the mask 591 increases across the second drain drift region 521 from its first side 522 to its second side 523.

Figure 15:
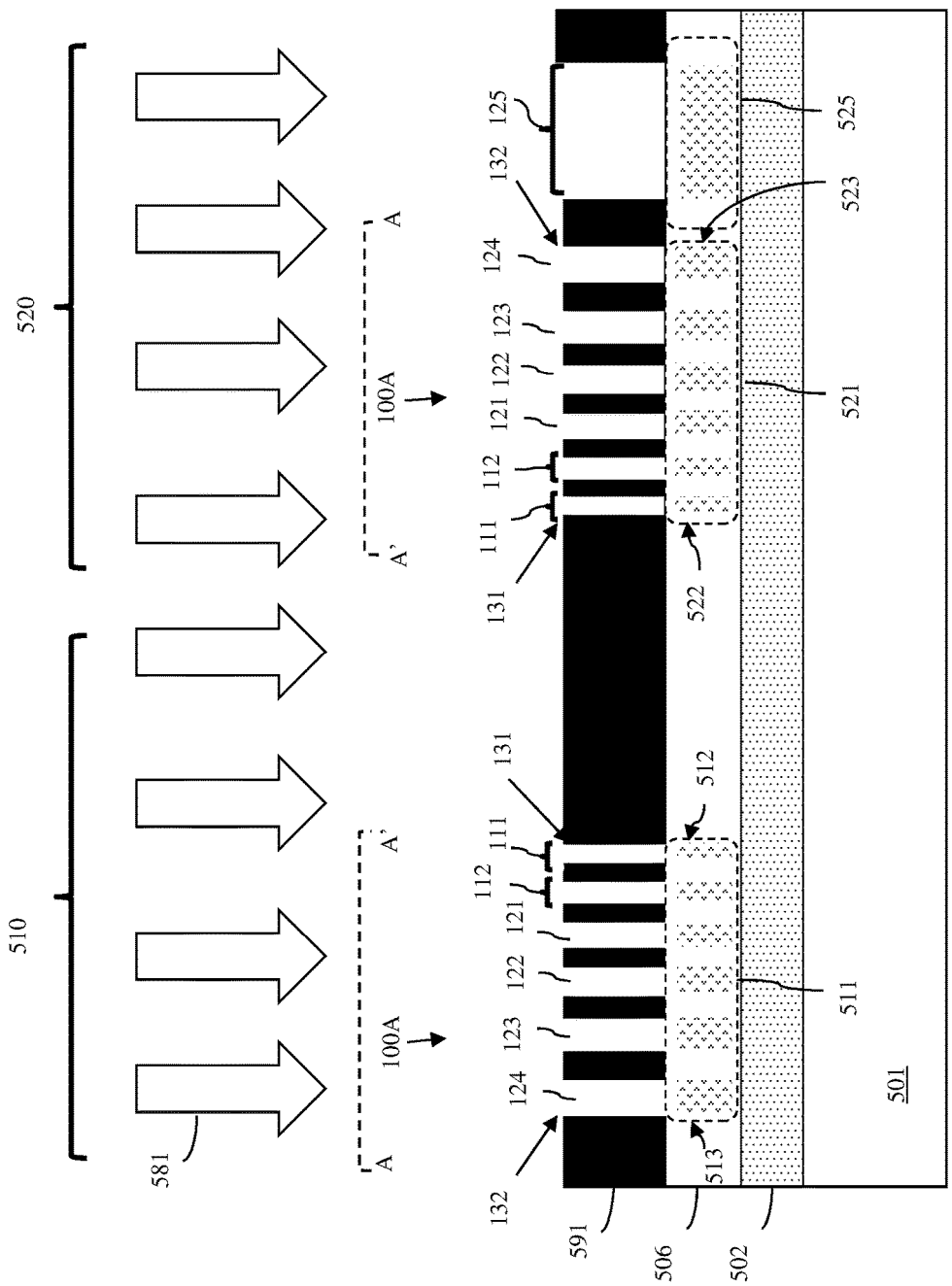
FIGS. 15 and 16 are cross-section diagrams each illustrating a different partially completed structure formed according to the method of FIG. 12.

After the mask 591 is formed, a dopant implant process can be performed in order to implant a first dopant 581 with a first type conductivity (e.g., an N-type conductivity) through the openings of each instance of the pattern 100A and into the drain drift regions 511 and 521 in the semiconductor layer 506 below (406, see FIG. 15). The implant energy associated with this dopant implant process 406 should be such that the first dopant 581 extends from the top surface of the semiconductor layer 506 to the bottom surface of the semiconductor layer 506 (or, in the case of a bulk semiconductor substrate, to the deep well between the upper and lower portions of the substrate). Exemplary specifications for this dopant implant process 406 include a phosphorous ion dose of 1E13 ions/cm$^2$ implanted with an ion implant energy of 300 KeV. After the dopant implant process 406, the mask 591 can be removed.

It should be noted that, optionally, the mask 591 can further have an additional opening aligned above a portion of the semiconductor layer 306 and, particularly, above a designated body region 525 for the second type LDMOSFET. This body region 525 can be positioned laterally adjacent to the second side 523 of the second drain drift region 521 of the second type LDMOSFET 520. If the patterned section 100A above the second drain drift region 521 of the second type LDMOSFET 520 corresponds to a portion of a racetrack pattern 100C as shown in FIG. 1C, this additional opening can correspond to the opening 125 at the center of the racetrack pattern 100C. In this case, the same dopant implant process 406 used to dope the drain drift regions 511 and 521 can also be used to implant the first dopant 581 through the additional opening 125 of the mask 591 and into the body region 525 of the second type LDMOSFET 520 such that the body region 525 of the second type LDMOSFET 520 has the first type conductivity.

Figure 16:
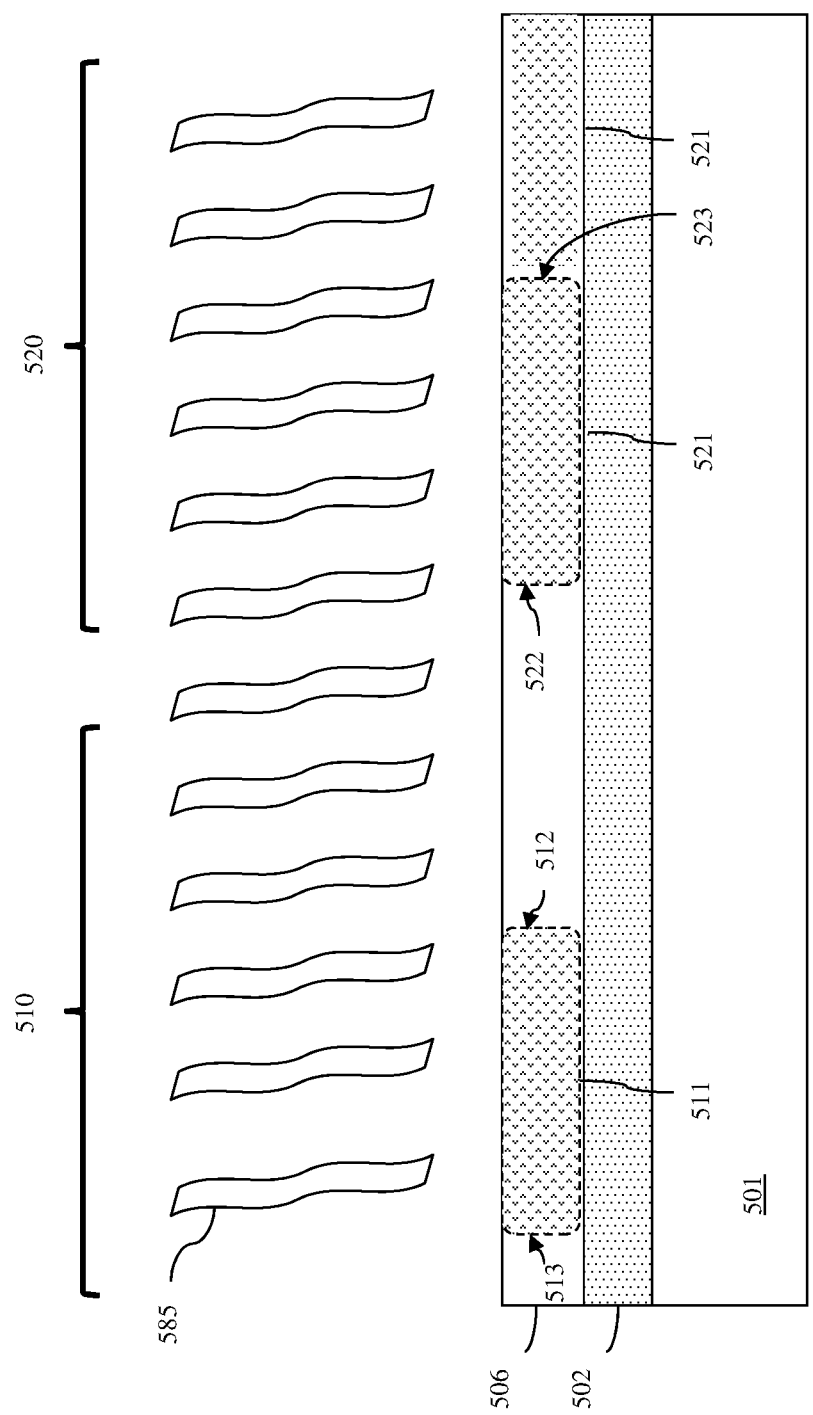
Figure 18B:
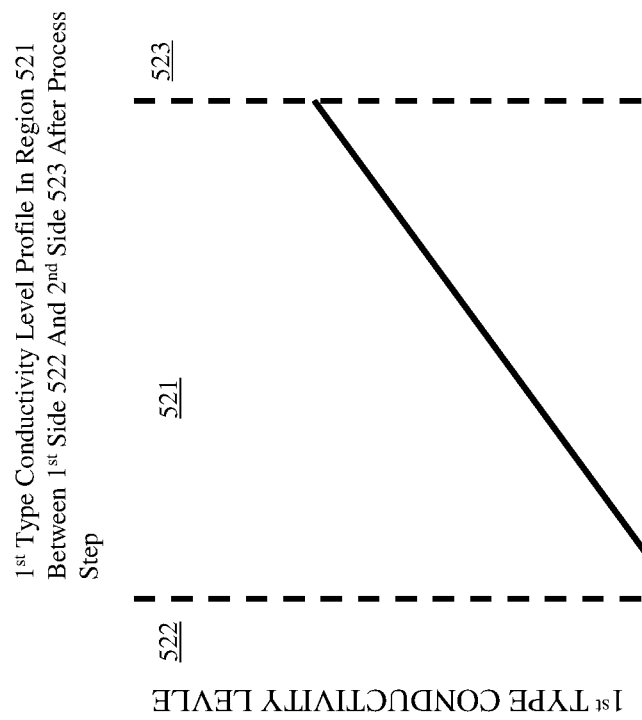
FIGS. 18A and 18B are graphs illustrating a dopant concentration profile and a corresponding conductivity level profile, respectively, across another region of FIG. 16.
Figure 18A:
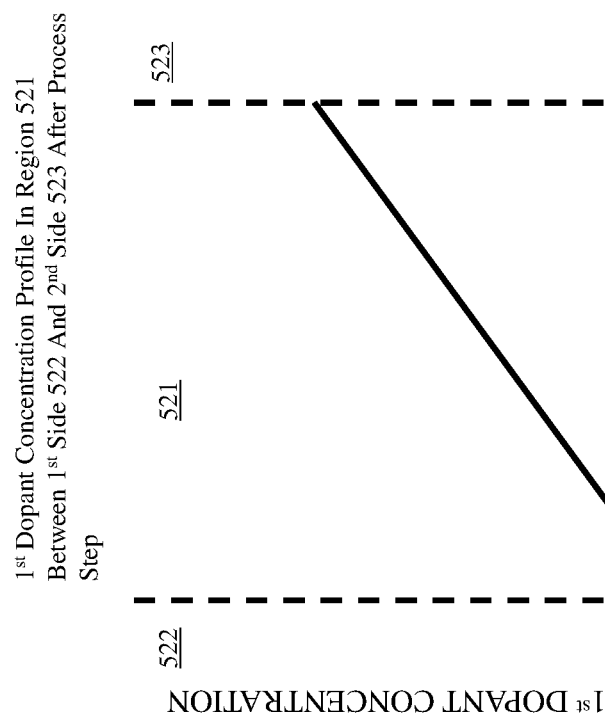

Following the dopant implant process 406, an anneal process can be performed (408, see FIG. 16). Specifically, the semiconductor layer 506 can be exposed to heat 585 at a relatively high temperature for a relatively long period of time in order to cause diffusion of the implanted first dopant 581, which was previously implanted into first drain drift region 511 of the first type LDMOSFET 510 and the second drain drift region 521 of the second type LDMOSFET 520. This anneal process 408 should be performed so that the first dopant 581 within the drain drift regions 511 and 521 diffuses and, as a result, the concentration profile of the first dopant 581 within the first drain drift region 511 of the first type LDMOSFET 510 increases essentially linearly from the first side 512 of that first drain drift region 511 to the second side 513, as shown in the graph of FIG. 17A, and, similarly, the concentration profile of the first dopant 581 within the second drain drift region 521 of the second type LDMOSFET 520 increases essentially linearly from the first side 522 of that second drain drift region 521 to the second side 523, as shown in the graph of FIG. 18A. As a result, at this point in the process, the first drain drift region 511 of the first type LDMOSFET 510 will have the first type conductivity at a level that increases essentially linearly from the first side 512 of that first drain drift region 511 to the second side 513, as illustrated in FIG. 17B, and the second drain drift region 521 of the second type LDMOSFET 520 will similarly have the first type conductivity at a level that increases essentially linearly from the first side 522 of that second drain drift region 521 to the second side 523, as illustrated in FIG. 18B. Those skilled in the art will recognize that the required anneal temperature as well as the required anneal duration for this anneal process will vary depending on the diffusion distance required to achieve the desired linearly graded conductivity level in the drain drift regions and that this diffusion distance will be dictated by the exact dimensions and spacing of the patterns of openings in the mask. Thus, the type of anneal process used can be any anneal process suitable for achieving the required anneal temperature for the required anneal duration. This anneal process could, for example, be a furnace anneal process or any other suitable anneal process. Exemplary specifications for a furnace anneal that can be used at process 208 include an anneal temperature ranging from 950-1350° C. (e.g., 1150° C.) and an anneal duration of 1½-2½ hours (e.g., 2 hours).

After the anneal process 408, various additional processes can be performed in order to complete the first type LDMOSFET 510 and the second type LDMOSFET 520 (409).

Figure 19:
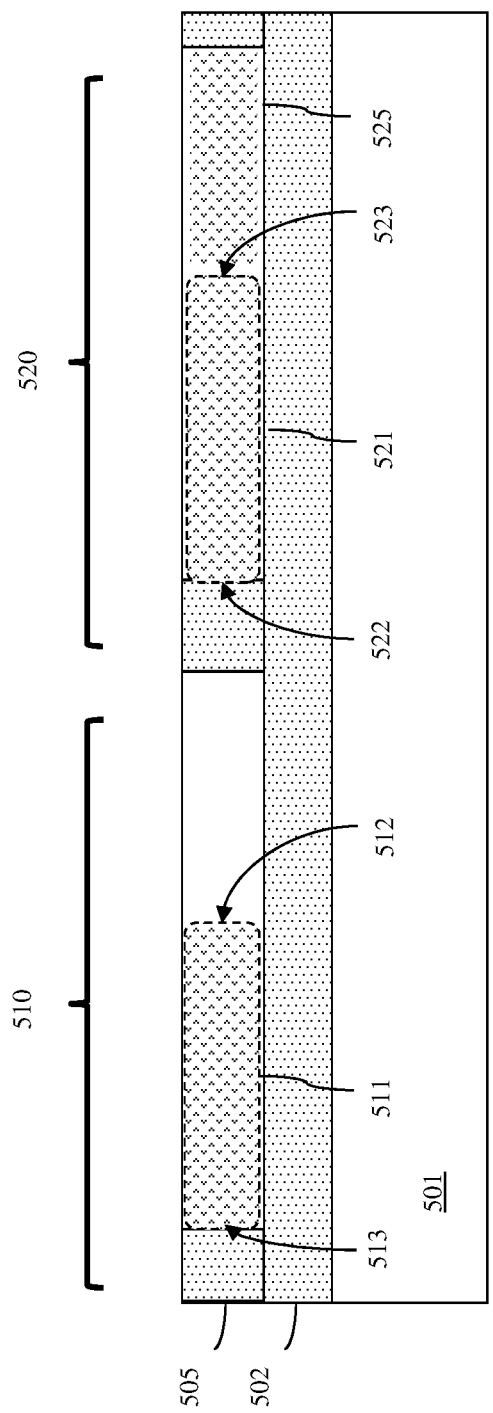
FIGS. 19-26 are cross-section diagrams each illustrating a different partially completed structure formed according to the method of FIG. 12; and, FIGS. 27A and 27B are graphs illustrating a dopant concentration profile and a corresponding conductivity level profile, respectively, across a region of FIG. 26.

For example, optionally, shallow trench isolation (STI) regions 505 can be formed (e.g., using conventional STI formation techniques) in order to define, within the semiconductor layer 506, the active semiconductor regions for the different type LDMOSFETs 510 and 520 and to electrically isolate the different type LDMOSFETs 510 and 520 from each other (410, see FIG. 19). For example, an STI region 505 can be formed in the semiconductor layer 506 around the first area for the first type LDMOSFET 510 such that it is immediately adjacent to the second side 513 of the first drain drift region 511 and separated from the first side 512 by some distance. An STI region 505 can also be formed in the semiconductor layer 506 around the second area for the second type LDMOSFET 520 such that it is immediately adjacent to the first side 522 of the second drain drift region 521 and separated from the second side 523 by some distance.

Figure 20:
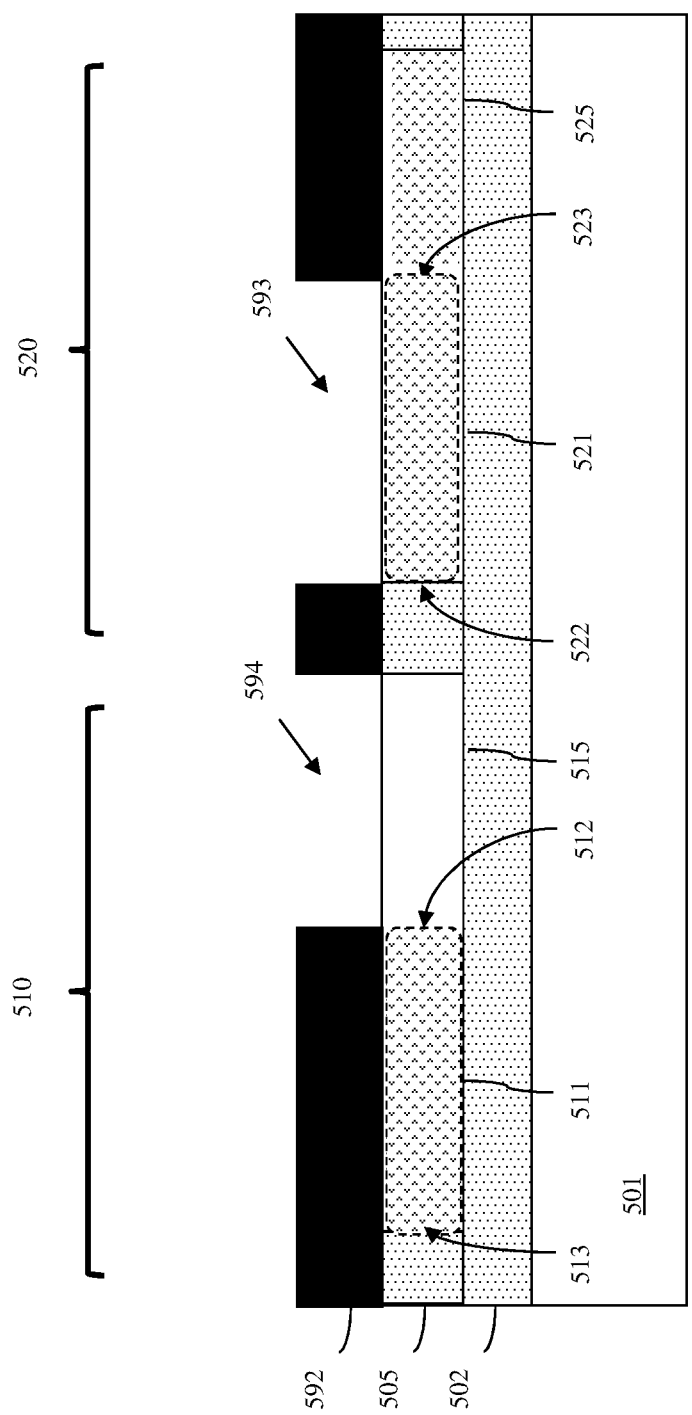
Figure 21:
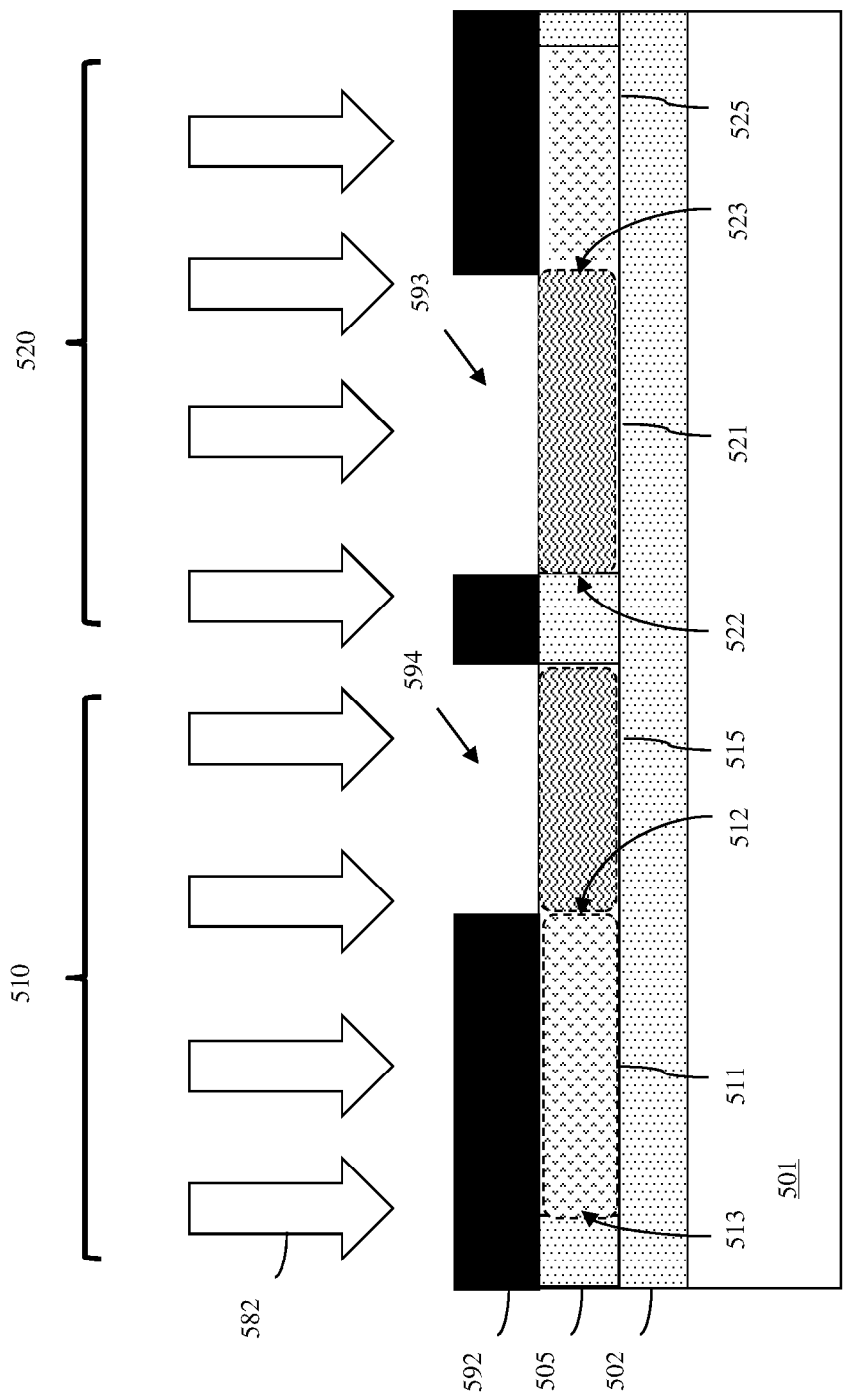

Subsequently, an additional mask 592 (e.g., a patterned photoresist layer or patterned hardmask layer, as discussed above) can be patterned so as to have an opening 593 that exposes a portion of the top surface of the semiconductor layer 506 above the second drain drift region 521 for the second type LDMOSFET 520 (414, see FIG. 20). After this additional mask 592 is formed, an additional dopant implant process can be performed in order to implant a second dopant 582 with the second type (e.g., P-type) conductivity essentially uniformly across the second drain drift region 521 from the first side 522 to the second side 523 (416, see FIG. 21). This additional dopant implant process 416 can specifically be a counter-doping process, wherein a predetermined concentration of the second dopant 582 is uniformly implanted into the second drain drift region 521 of the second type LDMOSFET 520. It should be noted that the implant energy associated with this additional dopant implant process 416 can be essentially the same as the implant energy associated with the dopant implant process 406 such that the second dopant 582 is implanted throughout the second drain drift region 521 from the top surface to the bottom surface of the semiconductor layer 506.

It should also be noted that, optionally, the additional mask 592 can further have an additional opening 594 aligned above another portion of the semiconductor layer 306 and, particularly, above a designated body region 515 for the first type LDMOSFET. This body region 515 can be positioned laterally adjacent to the first side 512 of the first drain drift region 511 of the first type LDMOSFET 510. In this case, the same dopant implant process 416 used to counter-dope the second drain drift region 521 of the second type LDMOSFET can also be used to implant the second dopant 582 through the additional opening 594 of the mask 592 and into the body region 515 of the first type LDMOSFET 520 such that the body region 515 of the first type LDMOSFET 510 has the second type conductivity.

The additional mask 592 can be removed following the additional dopant implant process 416.

Figure 22:
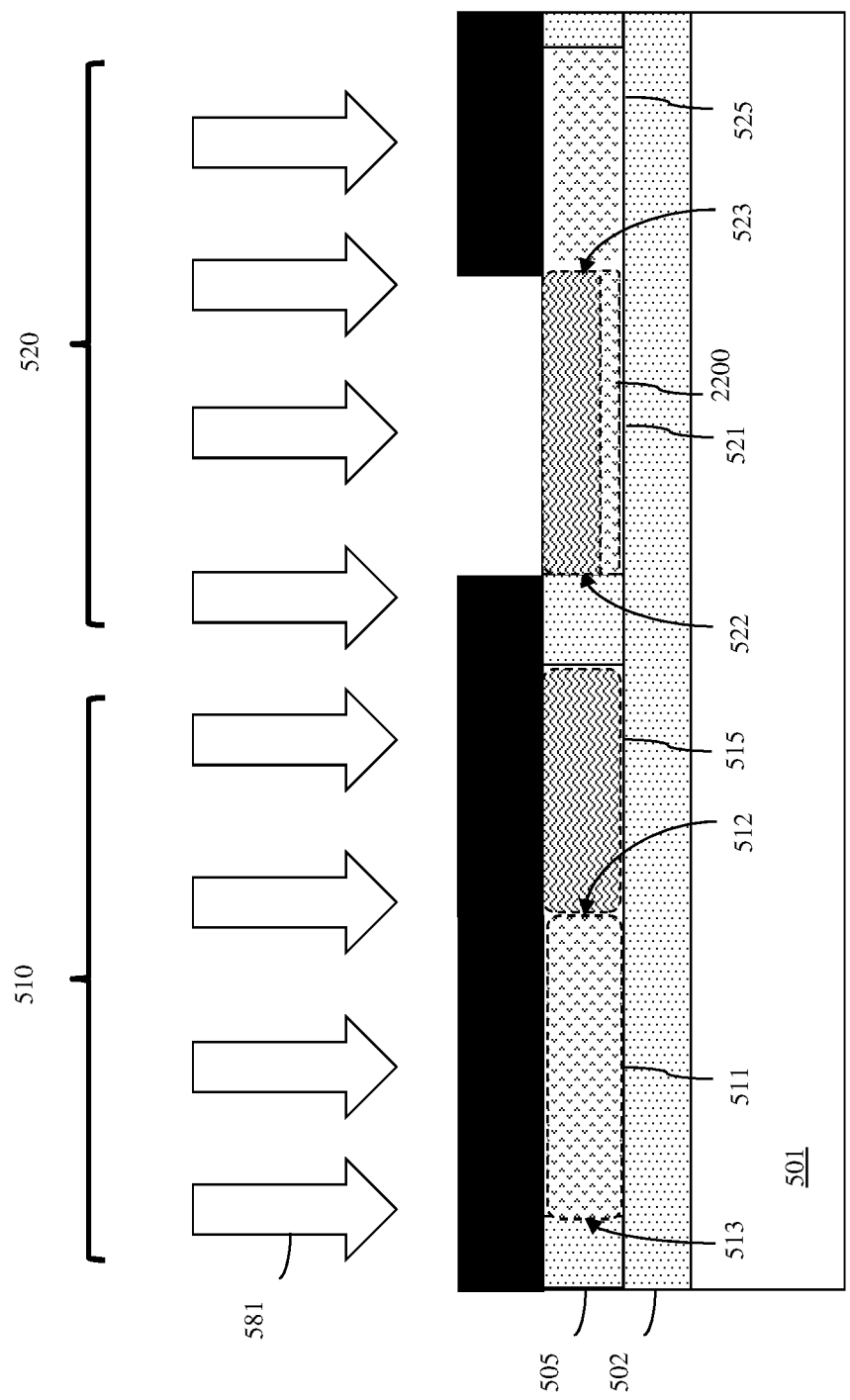

Optionally, yet another masked dopant implant process can be performed, as shown in FIG. 22, and used during another dopant implant process to implant the first dopant 581 into the lower portion of the second drain drift region 521 of the second type LDMOSFET 520 to form a buried well 2200 (also known as a "tongue"). This buried well 2200 can be formed so as to have the first type conductivity (e.g., N-type conductivity) and so as to traverse the lower portion of the second drain drift region 521 from the first side 522 to the body region 525 at the second side 523.

Figure 23:
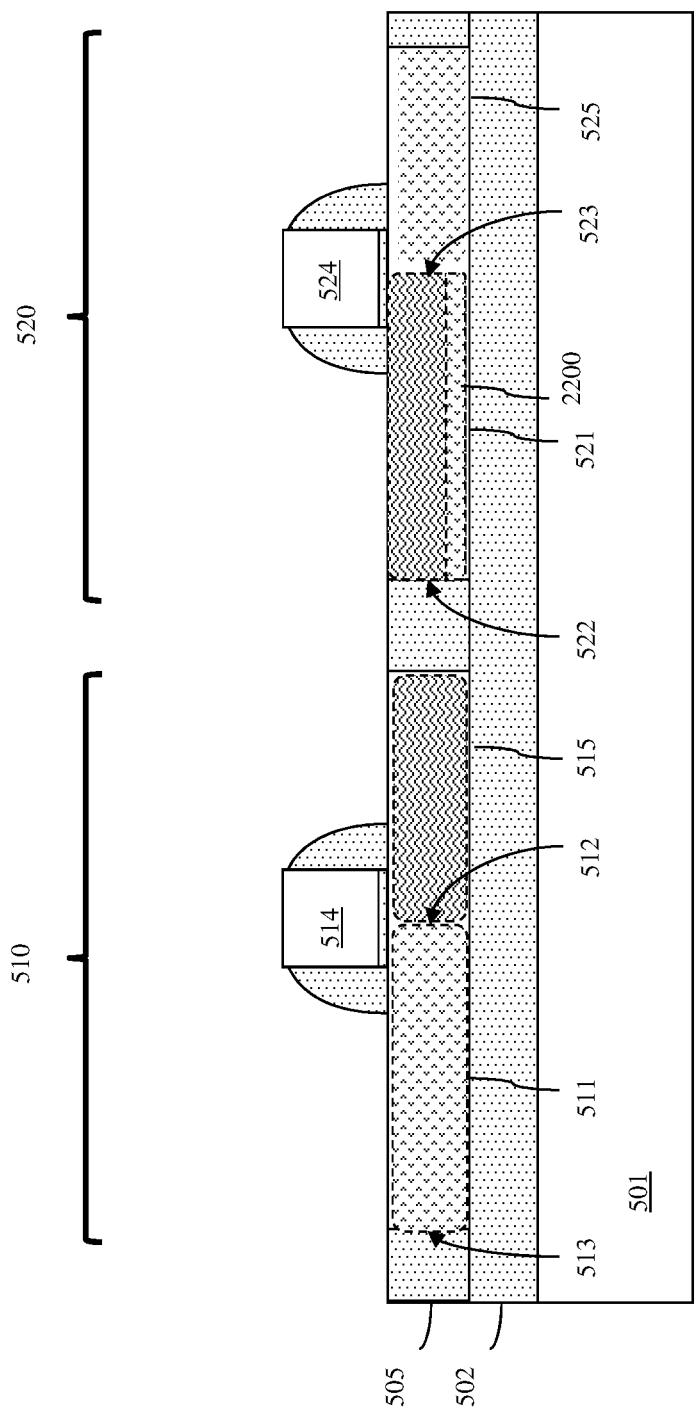

Subsequently, gate structures for the different type LDMOSFETs 510 and 520 can be formed on the top surface of the semiconductor layer 506 (418, see FIG. 23). For example, a gate dielectric layer (e.g., a silicon dioxide gate dielectric layer or other suitable gate dielectric layer) can be formed immediately adjacent to the top surface of the semiconductor layer 506 and a gate conductor layer (e.g., a polysilicon gate conductor layer or other suitable gate conductor layer) can be formed on the gate dielectric layer. The gate dielectric layer/gate conductor layer stack can then be patterned (e.g., lithographically) and etched to form a first gate structure 514 that is aligned above the interface between the first drain drift region 511 and the first body region 515 of the first type LDMOSFET 510 and second gate structure 524 that is aligned above the interface between the second drain drift region 521 and the second body region 525 of the second type LDMOSFET 520. It should be understood that alternatively replacement metal gate processes could be performed. That is, at this point in the processing, dummy gate structures could be formed above the interfaces between the drain drift regions and wells, as discussed above, and these dummy gate structures could be replaced with replacement metal gate structures during subsequent processing.

Figure 24:
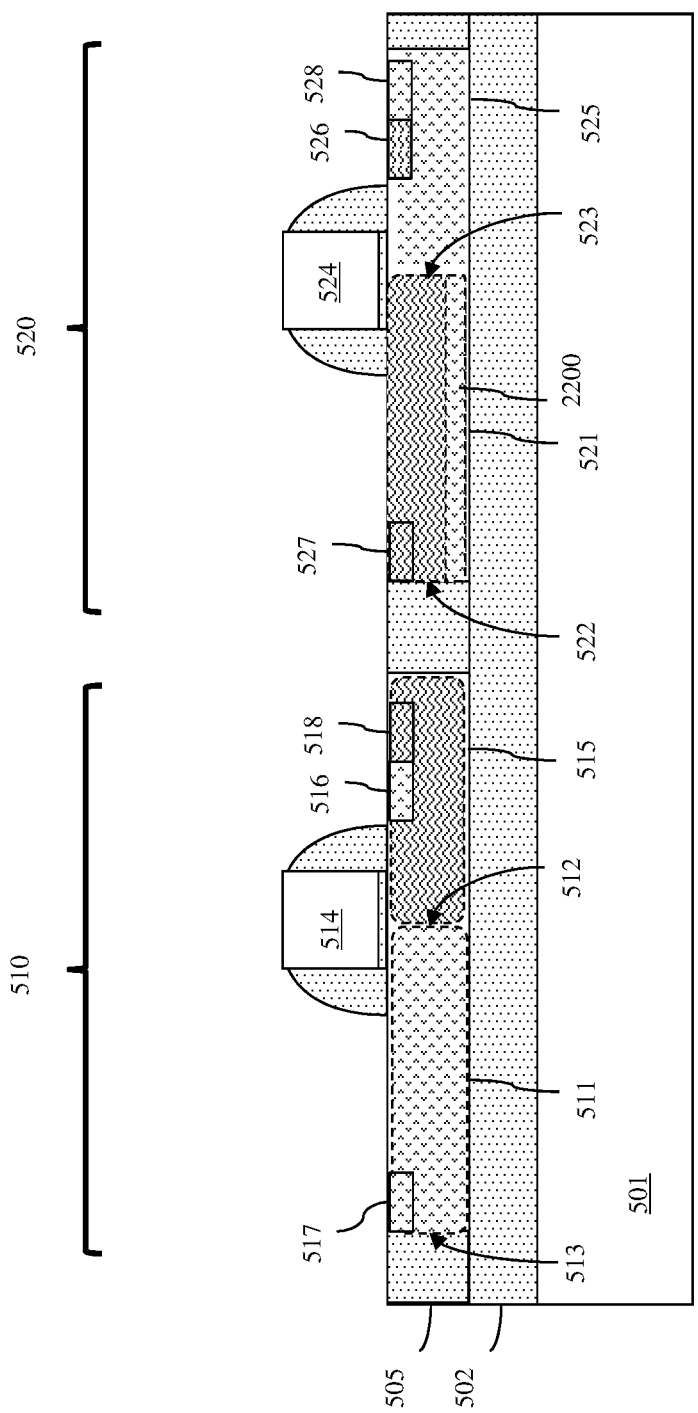

In any case, after the gate structures 514, 524 (or dummy gate structures, if applicable) are formed, additional conventional dopant implantation process can be performed in order to appropriately dope the gate conductor layers of the gate structure 514, 524, as necessary, and to form additional dopant implant regions for the different type LDMOSFETs 510 and 520. The additional dopant implant regions can include, but are not limited to, the following: halo regions (not shown); source/drain extension regions (not shown); first source and drain regions 516-517 with the first type conductivity for the first type LDMOSFET 510 and second source and drain regions 526-527 with the second type conductivity for the second type LDMOSFET 520; and a first body contact region 518 with the second type conductivity for the first type LDMOSFET 510 and a second body contact region 528 with the first type conductivity for the second type LDMOSFET (420, see FIG. 24). For example, during the same dopant implant process, the following dopant implant regions having the first type (e.g., N-type) conductivity at a higher conductivity level than the first drain drift region 511 can be formed near the top surface of the semiconductor layer 506: (1) for the first type LDMOSFET 510, a first drain region 517 within the first drain drift region 511 at the second side 513 adjacent to the STI region 505 and a first source region 516 within the first body region 515, wherein the first drain region 517 is separated from the gate structure 514 by a greater distance than the first source region 516; and (2) for the second type LDMOSFET 520, a second body contact region 528 within the second body region 525. During another dopant implant process, the following dopant implant regions having the second type (e.g., P-type) conductivity at a higher level than the second drain drift region 521 can be formed near the top surface of the semiconductor layer: (1) for the second type LDMOSFET 520, a second drain region 527 within the second drain drift region 521 at the first side 522 adjacent to the STI region 505 and a second source region 526 within the second body region 525 between the second gate structure 524 and the contact region 528, wherein the drain region 527 is separated from the gate structure 524 by a greater distance than the source region 526; and (2) for the first type LDMOSFET 510, a first body contact region 518 within the first body region 515 such that the first source region 516 is between the first gate structure 514 and the first body contact region 518. Techniques for forming the above-described dopant implant regions at process 420 are well known in the art and, thus, the details of those techniques are omitted from this specification in order to allow the reader to focus on the salient aspect of the disclosed method.

Figure 25:
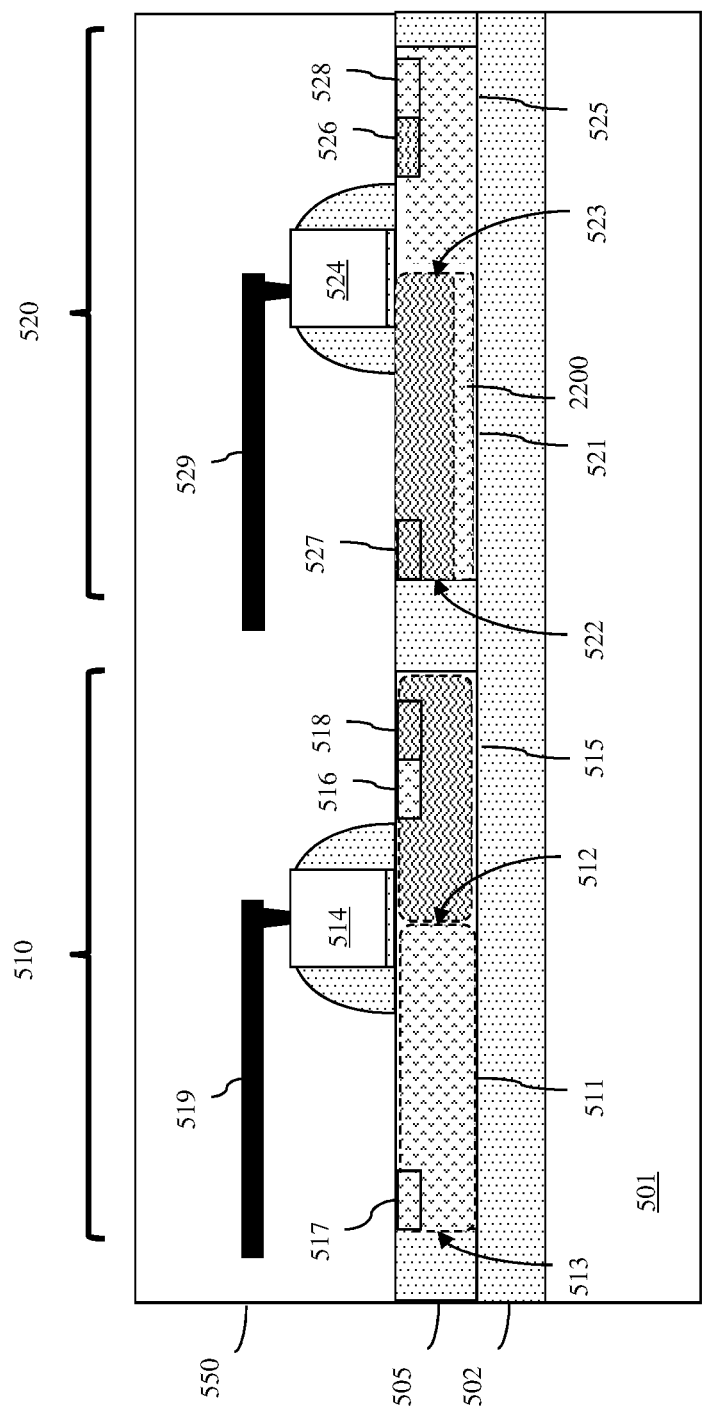

Subsequently, one or more layers of interlayer dielectric (ILD) material 550 can be formed on the different type LDMOSFETs 510 and 520 and, within the ILD material 550, conductive field plates 519, 529 can be formed above the drain drift regions 511, 521, respectively (422, see FIG. 25). The ILD material 550 can be, for example, silicon oxide or any other suitable ILD material (e.g., borophosphosilicate glass (BPSG), tetraethyl orthosilicate (TEOS), fluorinated tetraethyl orthosilicate (FTEOS), etc.). The conductive field plates 519, 529 can be, for example, doped polysilicon field plates or metal field plates. In any case, these conductive field plates can traverse the drain drift regions from the first side to the second side. Techniques for depositing ILD material and forming conductive field plates within the ILD material are well known in the art and, thus, the details of those techniques are omitted from this specification in order to allow the reader to focus on the salient aspect of the disclosed method.

Figure 26:
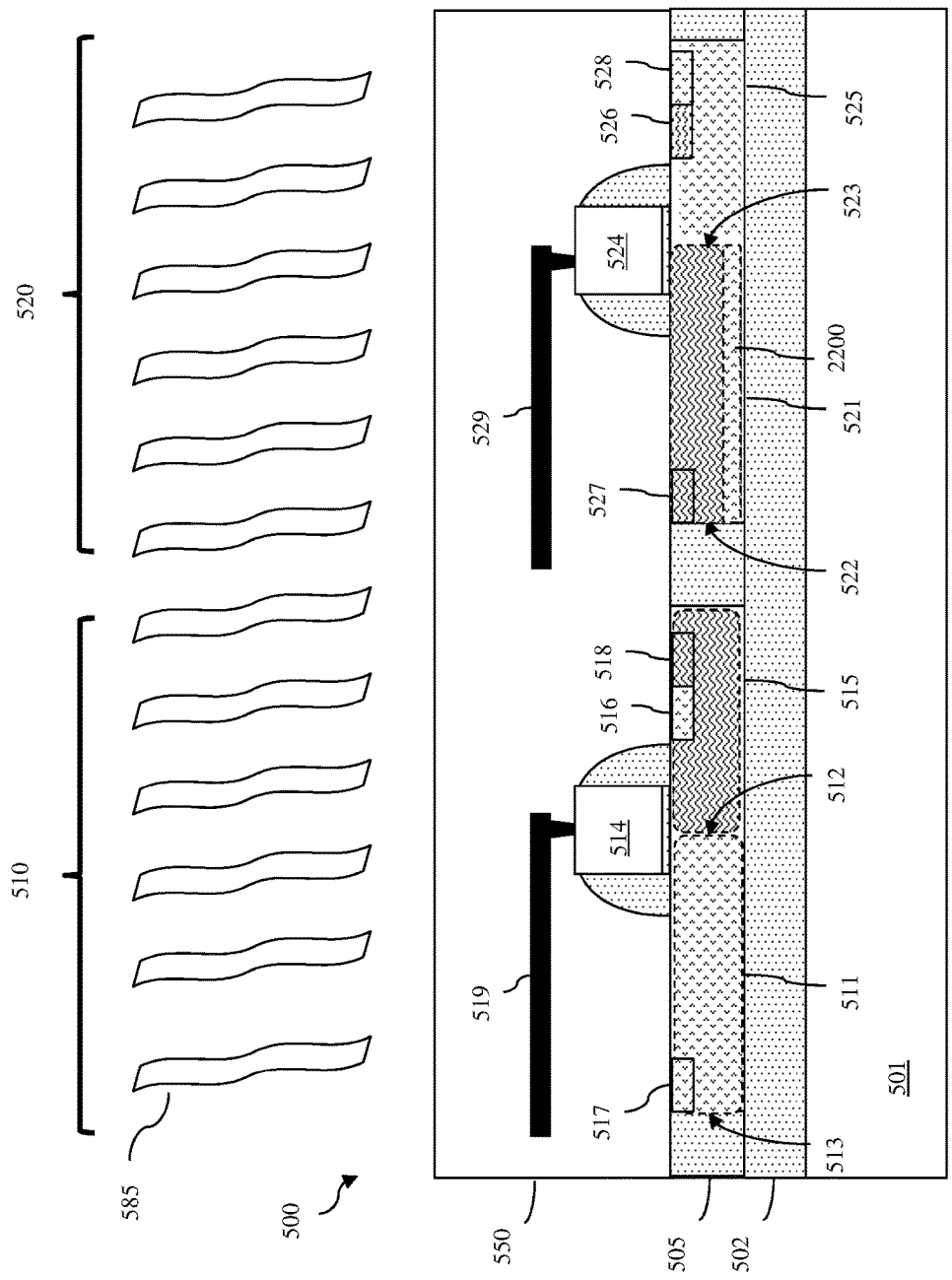

Then, an additional anneal process can be performed (424). In this additional anneal process 424, the structure formed, as described above, can be exposed to heat 585 at a relatively high temperature for a short period of time in order to electrically activate any dopants implanted into the different LDMOSFETs 510, 520, as shown in FIG. 26. It should be noted that the concentration of the second dopant 582 used during the additional dopant implant process 416 and the specifications for the additional anneal process 424 (e.g., the anneal temperature and the anneal duration) should be predetermined in order to ensure the following: (1) only minimal diffusion of the second dopant 582; (2) the second drain drift region 521 of the second type LDMOSFET takes on the second type conductivity from the first side 522 to the second side 623; and (3) although the concentration of the second dopant 582 is approximately uniform across the second drain drift region 521 from the first side 522 to the second side 523, as shown in the graph of FIG. 27A, the level of conductivity (i.e., the second type conductivity level) increases essentially linearly from the second side 523 to the first side 522 as shown in the graph of FIG. 27B, because of the previous doping of the second drain drift region 521 with the first dopant at process 406. This additional anneal process can be, for example, a rapid thermal anneal (RTA) process or any other suitable anneal process. Exemplary specifications for a RTA process that can be used at process 424 include an anneal temperature ranging from 900-1000° C. (e.g., 950° C.) and an anneal duration of 3-7 seconds (e.g., 5 seconds).

It should be noted that the exemplary process steps described above are offered for illustration purposes and are not intended to be limiting. For example, processes 404-406, described above, use a single mask 591 and dopant implant process to dope the first drain drift region 511 of the first type LDMOSFET, the second drain drift region 521 of the second type LDMOSFET and the body region 525 of the second type LDMOSFET. It should be understood that, alternatively, multiple discrete masked implantation processes could be used to dope these various regions. Similarly, processes 414-416, described above, use a single mask 592 to dope the first body region 515 of the first LDMOSFET 510 and to counter-dope the second drain drift region 521 of the second type LDMOSFET 520. It should be understood that, alternatively, multiple discrete masked implantation processes could be used to dope these various regions. Additionally, process 410, described above, forms STI regions around and between the LDMOSFETs 510, 520. However, it should be understood that, alternatively, instead of STI regions other forms of isolation may be used around and between the LDMOSFETs and/or not all of the LDMOSFETs formed may be isolated as shown.

Also disclosed herein are various semiconductor structures, which are formed according to the above-described methods and which incorporate at least one semiconductor device having a specific region with a linearly graded conductivity level. For example, referring to FIG. 26, disclosed herein is a semiconductor structure 500 that incorporates a first type LDMOSFET 510 and/or a second type LDMOSFET 520, wherein each LDMOSFET has a drain drift region with a linearly graded conductivity level for a reduced 'ON' resistance (Ron).

Specifically, the semiconductor structure 500 can have a semiconductor layer 506. This semiconductor layer 506 can be a semiconductor layer of a semiconductor-on-insulator (SOI) wafer, which includes a semiconductor substrate 501 (e.g., a silicon substrate or any other suitable semiconductor substrate), an insulator layer 502 (e.g., a silicon dioxide ($SiO_2$) layer or any other suitable insulator layer) on the semiconductor substrate 501 and a semiconductor layer 506 (e.g., a silicon layer, a silicon germanium layer, a gallium nitride layer or any other suitable semiconductor layer) on the insulator layer 502. Alternatively, the semiconductor layer 506 can be an upper portion of a bulk semiconductor wafer (e.g., a silicon wafer or any other suitable wafer, such as a hybrid orientation (HOT) wafer), wherein the upper portion is isolated from a lower portion of the wafer, for example, by deep well (not shown).

As mentioned above, the semiconductor structure 500 can have a first type LDMOSFET 510 (e.g., an N-type LDMOSFET) and/or a second type LDMOSFET 520 (e.g., a P-type LDMOSFET). Active semiconductor regions for the LDMOSFETs can be defined in the semiconductor layer 506 by shallow trench isolation (STI) regions 505. Various different configurations for STI regions are well known in the art and, thus, the details of such STI regions are omitted from this specification in order to allow the reader to focus on the salient aspects of the disclosed structures.

The first type LDMOSFET 510 can have, within the semiconductor layer 506, a first drain drift region 511 and a first body region 515. Specifically, the first drain drift region 511 can have a first side 512 and a second side 513, which is opposite the first side 512 and immediately adjacent to an STI region 505. The first drain drift region 511 can be doped with a first dopant having a first type conductivity (e.g., N-type conductivity) and the concentration profile of the first dopant within the first drain drift region 511 can increase essentially linearly from the first side 512 to the second side 513, as shown in the graph of FIG. 17A, such that the first drain drift region 511 has the first type conductivity at a level that increases essentially linearly from the first side 512 to the second side 513, as illustrated in FIG. 17B. The first body region 515 can be positioned laterally immediately adjacent to the first side 512 of the first drain drift region 511 and can extend laterally from the first side 512 of the first drain drift region 511 to an STI region 505. The first body region 515 can be doped with a second dopant having a second type conductivity (e.g., P-type conductivity) such that the first body region 515 has the second type conductivity.

The first type LDMOSFET 510 can further have a first gate structure 514 on the top surface of the semiconductor layer 506 aligned above the interface between the first drain drift region 511 and the first body region 515. The first gate structure 514 can, for example, include a gate dielectric layer (e.g., a silicon dioxide gate dielectric layer or other suitable gate dielectric layer) immediately adjacent to the top surface of the semiconductor layer 506 and a gate conductor layer (e.g., a polysilicon gate conductor layer or other suitable gate conductor layer) on the gate dielectric layer (as shown). Alternatively, the first gate structure 514 can be a replacement metal gate structure.

The first type LDMOSFET 510 can further have a first drain region 517, a first source region 516 and a first body contact region 518. The first drain region 517 can be positioned at the top surface of the semiconductor layer 506 in the first drain drift region 511 adjacent to the adjacent to an STI region 505 at the second side 513 and the first source region 516 can be positioned at the top surface of the semiconductor layer 506 in the first body region 515. Thus, the first drain region 517 and the first source region 516 are on opposing sides of the first gate structure 514. Additionally, the first gate structure 514 can be positioned relative to the first drain region 517 and the first source region 516 such that there is a greater distance between the first gate structure 514 and the first drain region 517 than there is between the first gate structure 514 and the first source region 516. The first drain region 517 and the first source region 516 can each have the first type conductivity (e.g., N-type conductivity) at a higher conductivity level than the first drain drift region 511. The first body contact region 518 can be within the first body region 515 and positioned laterally between the first source region 516 and the STI region 505. The first contact region 518 can have the second type conductivity (e.g., P-type conductivity) at a higher conductivity level than the first body region 515.

The first type LDMOSFET 510 can further be covered by one or more layers of interlayer dielectric (ILD) material 550 and can have, within the ILD material 550, a first conductive field plate 519 aligned above the first drain drift region 511. The ILD material 550 can be, for example, silicon oxide or any other suitable ILD material (e.g., borophosphosilicate glass (BPS G), tetraethyl orthosilicate (TEOS), fluorinated tetraethyl orthosilicate (FTEOS), etc.). The first conductive field plate 519 can be, for example, a doped polysilicon field plate or a metal field plate. In any case, this first conductive field plate 519 can traverse the first drain drift region 511 from the first side 512 to the second side 513.

The second type LDMOSFET 520 can have, within the semiconductor layer 506, a second drain drift region 521 and a second body region 525. Specifically, the second drain drift region 521 can have a first side 522, which is immediately adjacent to an STI region 505, and a second side 523 opposite the first side 522. The second drain drift region 521 can be doped with a first dopant having the first type conductivity (e.g., N-type conductivity) and the concentration profile of the first dopant within the second drain drift region 521 can increase essentially linearly from the first side 522 to the second side 523, as shown in the graph of FIG. 18A. The second drain drift region 521 can also be counter-doped with a second dopant having the second type conductivity (e.g., P-type conductivity). Specifically, the second drain drift region 521 can also be uniformly doped with the second dopant across the second drain drift region 521 from the first side 522 to the second side 523. The amount of counter-doping with the second dopant in the second drain drift region 521 is sufficient to ensure, although the concentration of the second dopant is approximately uniform across the second drain drift region 521 from the first side 522 to the second side 523, as shown in the graph of FIG. 27A, the level of conductivity (i.e., the second type conductivity level) increases essentially linearly from the second side 523 to the first side 522, as shown in the graph of FIG. 27B, because of the presence of the first dopant. The second body region 525 can be positioned laterally immediately adjacent to the second side 523 of the second drain drift region 521 and can extend laterally from the second side 523 of the second drain drift region 521 to an STI region 505. The second body region 525 can be doped with the first dopant such that the second body region has the first type conductivity (e.g., N-type conductivity).

The second type LDMOSFET 520 can further have a second gate structure 524 on the top surface of the semiconductor layer 506 aligned above the interface between the second drain drift region 521 and the second body region 525. The second gate structure 524 can, for example, include a gate dielectric layer (e.g., a silicon dioxide gate dielectric layer or other suitable gate dielectric layer) immediately adjacent to the top surface of the semiconductor layer 506 and a gate conductor layer (e.g., a polysilicon gate conductor layer or other suitable gate conductor layer) on the gate dielectric layer (as shown). Alternatively, the gate structure 524 can be a replacement metal gate structure.

The second type LDMOSFET 520 can further have a second drain region 527, a second source region 526 and a second body contact region 528. The second drain region 527 can be in the second drain drift region 521 positioned at the first side 522 adjacent to an STI region 505 and the second source region 526 can be positioned in the second body region 525. Thus, the second drain region 527 and the second source region 526 are on opposing sides of the second gate structure 524. Additionally, the second gate structure 524 can be positioned relative to the second drain region 527 and the second source region 526 such that the second gate structure 524 is separated from the second drain region 527 by a greater distance than the second gate structure 524 is separated from the second source region 526. The second drain region 527 and the second source region 526 can each be doped with the second dopant so as to have the second type conductivity (e.g., P-type conductivity) at a higher conductivity level than the second drain drift region 521. The second body contact region 528 can be within the second body region 525 and can be positioned laterally between the second source region 526 and an STI region 505. The second body contact region 528 can be doped with the first dopant and can have the first type conductivity (e.g., N-type conductivity) at a higher conductivity level than the second body region 525.

Optionally, the second type LDMOSFET 520 can further have a buried well 2200 (also known as a "tongue") that traverses the lower portion of the second drain drift region 521 from the first side 522 to the body region 525 at the second side 523. This buried well 2200 can have the first type conductivity (e.g., N-type conductivity).

The second type LDMOSFET 520 can further be covered by one or more layers of interlayer dielectric (ILD) material 550 and can have, within the ILD material 550, a second conductive field plate 529 aligned above the second drain drift region 521. The ILD material 550 can be, for example, silicon oxide or any other suitable ILD material (e.g., borophosphosilicate glass (BPSG), tetraethyl orthosilicate (TEOS), fluorinated tetraethyl orthosilicate (FTEOS), etc.). The second conductive field plate 529 can be, for example, a doped polysilicon field plate or a metal field plate. In any case, this second conductive field plate 529 can traverse the second drain drift region 521 from the first side 522 to the second side 523.

For purposes of illustration, the disclosed methods and structures are described above using examples wherein the first type conductivity is N-type conductivity and the second type conductivity is P-type conductivity. However, it should be understood that, alternatively, the first type conductivity could be P-type conductivity and the second type conductivity could be N-type conductivity. In any case, those skilled in the art will recognize that different dopants can be used during different dopant implant processes to form, within a semiconductor layer, different regions with different type conductivities and that the dopants used during these different dopant implant processes will vary depending upon both the type of semiconductor material being used and the desired type conductivity (e.g., N-type conductivity or P-type conductivity). For example, a silicon-based semiconductor material can be doped during a dopant implant process with a Group III dopant, such as boron (B) or indium (In), in order to achieve P-type conductivity. Alternatively, a silicon-based semiconductor material can be doped during a dopant implant process with a Group V dopant, such as arsenic (As), phosphorous (P) or antimony (Sb), in order to achieve N-type conductivity. A gallium nitride (GaN) or gallium arsenide (GaAs)-based semiconductor material can be doped during a dopant implant process with beryllium (Be) or magnesium (Mg) in order to achieve P-type conductivity. Alternatively, the gallium nitride (GaN) or gallium arsenide (GaAs)-based semiconductor material can be doped during a dopant implant process with silicon (Si) in order to achieve N-type conductivity. Those skilled in the art will further recognize that by the level of conductivity will vary depending upon the dopant concentration used and upon any counter doping performed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are methods of forming a semiconductor structure with a dopant implant region having a given type conductivity at a level that increases essentially linearly from one side of the region to the other. To achieve the desired linearly graded conductivity level, these methods employ a unique mask, which has openings arranged in a particular pattern. These methods can, for example, be used to form a planar lateral double-diffused metal oxide semiconductor field effect transistor (LDMOS-FET) with a drain drift region having an appropriate type conductivity at a level that increases essentially linearly from the body region to the drain region for a reduced 'ON' resistance (Ron). Furthermore, as discussed in greater detail below, these methods also provide for improve manufacturability in that multiple instances of this same pattern can be used during a single dopant implant process to implant a first dopant with a first type (e.g., N-type) conductivity into the drain drift regions of both first and second type LDMOS-FETs (e.g., N and P-type LDMOSFETs, respectively). In this case, the drain drift region of a second type LDMOS-FET can subsequently be uniformly counter-doped with a second dopant having the second type (e.g., a P-type) conductivity in order to achieve the desired linearly graded conductivity level therein. Also disclosed above are the resulting semiconductor structures.

What is claimed is:

1. A method comprising:
    forming a mask on a semiconductor layer,
        the mask having multiple openings that extend vertically to a region of the semiconductor layer having a first side and a second side opposite the first side, and
        the multiple openings being arranged in a pattern,
        the pattern comprising at least one set of aligned holes above a first portion of the region at the first side and trenches above a second portion of the region at the second side, and
        the trenches being elongated relative to the holes, wherein widths of the holes and the trenches increase from the first side to the second side;
    after the forming of the mask, performing a dopant implant process to implant a first dopant with a first type conductivity into the region; and,
    performing an anneal, the anneal causing diffusion of the first dopant such that a concentration profile of the first dopant increases essentially linearly from the first side to the second side.

2. The method of claim 1, further comprising:
    forming an additional mask on the semiconductor layer, the additional mask having an opening that exposes the region; and,
    performing an additional dopant implant process to implant a second dopant essentially uniformly across the region, the second dopant having a second type conductivity and the additional dopant implant process being performed such that the region has the second type conductivity at a level that increases essentially linearly from the second side to the first side.

3. The method of claim 1, the pattern being a portion of a racetrack pattern with the trenches being adjacent portions of track-shaped trenches and with the at least one set of aligned holes being a portion of at least one track-shaped arrangement of holes.

4. The method of claim 3, the track-shaped trenches being arranged concentrically around the at least one track-shaped arrangement of holes.

5. The method of claim 3, the at least one track-shaped arrangement of holes being arranged concentrically around the track-shaped trenches.

6. The method of claim 1, the holes being circular-shaped holes.

7. A method comprising:
    forming a mask on a semiconductor layer,
        the mask having patterned sections above drain drift regions in the semiconductor layer,
        the drain drift regions comprising a first drain drift region of a first field effect transistor and a second drain drift region of a second field effect transistor,
        each drain drift region having a first side and a second side opposite the first side,
        each patterned section having a pattern of multiple openings that extend vertically to a corresponding one of the drain drift regions,
        the pattern comprising at least one set of aligned holes above a first portion of the corresponding one of the drain drift regions at the first side and trenches above a second portion of the corresponding one of the drain drift regions at the second side, and the trenches being elongated relative to the holes, wherein widths of the holes and the trenches increase from the first side to the second side;

after the forming of the mask, performing a dopant implant process to implant a first dopant into the drain drift regions;

performing an anneal such that each drain drift region has the first type conductivity at a level that increases essentially linearly from the first side to the second side;

forming an additional mask on the semiconductor layer, the additional mask covering the first drain drift region and having an opening that exposes the second drain drift region; and, after the forming of the additional mask, performing an additional dopant implant process to implant a second dopant essentially uniformly across the second drain drift region such that, following the performing of the additional dopant implant process, the second drain drift region has the second type conductivity at a level that increases essentially linearly from the second side of the second drain drift region to the first side of the second drain drift region.

8. The method of claim 7, the additional mask further having an additional opening that exposes a first body region of the first field effect transistor in the semiconductor layer positioned laterally adjacent to the first side of the first drain drift region, the additional dopant implant process doping the first body region with the second dopant, and the method further comprising:

forming a first gate structure for the first field effect transistor above an interface between the first drain drift region and the first body region; and forming a first drain region in the first drain drift region and a first source region in the first body region, the first drain region being separated from the first gate structure by a greater lateral distance than the first source region.

9. The method of claim 8, the mask further having an additional opening above a second body region of the second field effect transistor in the semiconductor layer positioned laterally adjacent to the second side of the second drain drift region, the dopant implant process further doping the second body region with the first dopant, and the method further comprising:

forming a second gate structure for the second field effect transistor above an interface between the second drain drift region and the second body region; and forming a second drain region in the second drain drift region and a second source region in the second body region, the second drain region being separated from the second gate structure by a greater lateral distance than the second source region.

10. The method of claim 7, the pattern being a portion of a racetrack pattern with the trenches being adjacent portions of track-shaped trenches and with the at least one set of aligned holes being a portion of at least one track-shaped arrangement of holes.

11. The method of claim 10, the track-shaped trenches being arranged concentrically around the at least one track-shaped arrangement of holes.

12. The method of claim 10, the at least one track-shaped arrangement of holes being arranged concentrically around the track-shaped trenches.

13. The method of claim 7, the holes being circular-shaped holes.

14. A method comprising:

forming a mask on a semiconductor layer, the mask having multiple openings that extend vertically to a region of the semiconductor layer having a first side and a second side opposite the first side, and the multiple openings being arranged in a pattern, the pattern comprising at least one set of aligned holes above a first portion of the region at the first side and trenches above a second portion of the region at the second side, and the trenches being elongated relative to the holes, wherein widths of the holes and the trenches increase from the first side to the second side;

after the forming of the mask, performing a dopant implant process to implant a first dopant into the region; and, performing an anneal, the anneal causing diffusion of the first dopant such that a concentration profile of the first dopant increases essentially linearly from the first side to the second side.

15. The method of claim 14, the first dopant having a first type conductivity and wherein, following the performing of the dopant implant process and the anneal, the region has the first type conductivity at a level that increases essentially linearly from the first side to the second side.

16. The method of claim 15, further comprising:

forming an additional mask on the semiconductor layer, the additional mask having an opening that exposes the region; and, performing an additional dopant implant process to implant a second dopant essentially uniformly across the region, the second dopant having a second type conductivity and the additional dopant implant process being performed such that the region has the second type conductivity at a level that increases essentially linearly from the second side to the first side.

17. The method of claim 14, the pattern being a portion of a racetrack pattern with the trenches being adjacent portions of track-shaped trenches and with the at least one set of aligned holes being a portion of at least one track-shaped arrangement of holes.

18. The method of claim 17, the track-shaped trenches being arranged concentrically around the at least one track-shaped arrangement of holes.

19. The method of claim 17, the at least one track-shaped arrangement of holes being arranged concentrically around the track-shaped trenches.

* * * * *